(12) United States Patent
Ando

(10) Patent No.: US 11,476,074 B2
(45) Date of Patent: Oct. 18, 2022

(54) VACUUM CHANNEL FIELD EFFECT TRANSISTOR, PRODUCING METHOD THEREOF, AND SEMICONDUCTOR DEVICE

(71) Applicants: Yoshiyuki Ando, Tokyo (JP); Rieko Ando, Tokyo (JP); Yukiko Noguchi, Tokyo (JP); Emiko Takahira, Tokyo (JP)

(72) Inventor: Yoshiyuki Ando, Tokyo (JP)

(73) Assignees: Yoshiyuki Ando, Tokyo (JP); Emiko Takahira, Tokyo (JP); Reiko Ando, Tokyo (JP); Yukiko Noguchi, Tokyo (JP)

( * ) Notice: Subject to any disclaimer, the term of this patent is extended or adjusted under 35 U.S.C. 154(b) by 0 days.

(21) Appl. No.: 17/324,923

(22) Filed: May 19, 2021

(65) Prior Publication Data

US 2021/0375571 A1    Dec. 2, 2021

(30) Foreign Application Priority Data

Sep. 10, 2020  (JP) .............................. JP2020152350

(51) Int. Cl.
*H01J 1/316*       (2006.01)
*H01L 29/786*      (2006.01)
(Continued)

(52) U.S. Cl.
CPC .............. *H01J 1/316* (2013.01); *H01J 1/308* (2013.01); *H01J 19/02* (2013.01); *H01L 29/786* (2013.01)

(58) Field of Classification Search
CPC .................................................. H01L 29/0847
See application file for complete search history.

(56) References Cited

U.S. PATENT DOCUMENTS

2001/0019279 A1\* 9/2001 Martin ............. H03K 19/00346
326/26
2001/0025963 A1\* 10/2001 Tashiro ............... H01L 27/0255
257/133
(Continued)

FOREIGN PATENT DOCUMENTS

CN       108242444 A     7/2018
JP       H04115441 A     4/1992
(Continued)

OTHER PUBLICATIONS

Srisonphan, S., Jung, Y. & Kim, H. Metal-oxide-semiconductor field-effect transistor with a vacuum channel. Nature Nanotech 7, 504-508 (2012).
(Continued)

*Primary Examiner* — John A Bodnar
(74) *Attorney, Agent, or Firm* — Fox Rothschild LLP; Robert Sacco; Carol E. Thorstad-Forsyth

(57) ABSTRACT

A vacuum channel field effect transistor includes a first insulator on a p-type semiconductor substrate, a gate electrode on the first insulator, a second insulator on the gate electrode, a drain electrode on the second insulator, and an n+ impurity diffusion layer in the surface of the p-type semiconductor substrate, the n+ impurity diffusion layer being in contact with a side wall including side faces of the first insulator, the gate electrode, and the second insulator. Application of predetermined voltages to the n+ impurity diffusion layer, the gate electrode, and the drain electrode causes charge carriers in the n+ impurity diffusion layer to travel through a vacuum or air faced by the side wall to the drain electrode, which can increase the source-drain current.

20 Claims, 20 Drawing Sheets

(51) Int. Cl.
*H01J 19/02* (2006.01)
*H01J 1/308* (2006.01)

(56) References Cited

U.S. PATENT DOCUMENTS

| | | | | |
|---|---|---|---|---|
| 2013/0299773 | A1* | 11/2013 | Kim | H01L 31/08 438/20 |
| 2014/0347771 | A1* | 11/2014 | Zhan | H02H 9/044 257/111 |
| 2017/0092778 | A1* | 3/2017 | Zhang | H01L 29/78642 |

FOREIGN PATENT DOCUMENTS

| | | |
|---|---|---|
| JP | 2002508596 A | 3/2002 |
| JP | 2003505844 A | 2/2003 |
| WO | 2016182080 A1 | 11/2016 |

OTHER PUBLICATIONS

Kohani Khoshkbijari, F., Sharifi, M.J. Reducing the gate current in vacuum channel field-emission transistors using a finger gate. J Comput Electron 19, 263-270 (2020).

Park, Injun, et al., and a New Slit-Type Vacuum-Channel Transistor, IEEE Transactions on Electron Devices, IEEE, 2014, vol. 61, No. 12, p. 4186-4191.

First Office Action issued in Chinese Patent Application No. 202110776227.5 dated Mar. 8, 2022.

\* cited by examiner

VACUUM CHANNEL FIELD EFFECT TRANSISTOR, PRODUCING METHOD THEREOF, AND SEMICONDUCTOR DEVICE

CROSS REFERENCE TO RELATED APPLICATIONS

This application claims the benefit of foreign priority to Japanese Patent Application No. 2020-152350, filed on Sep. 10, 2020, which is incorporated by reference in its entirety.

BACKGROUND

Technical Field

The present invention relates to a vacuum channel field effect transistor, a producing method thereof, and a semiconductor device.

Related Art

Vacuum channel field effect transistors (hereinafter may also be referred to as FETs) in which a vacuum is used as a medium for charge carriers are known as FETs suitable for high-speed operations (refer, for example, to Siwapon Srisonphan, Yun Suk Jung, and Hong Koo Kim, "Metal-oxide-semiconductor field-effect transistor with a vacuum channel," NATURE NANOTECHNOLOGY, VOL. 7, AUGUST 2012, and Fatemeh Kohani Khoshkbijari, and Mohammad Javad Sharifi, "Reducing the gate current in vacuum channel field-emission transistors using a finger gate," Journal of Computational Electronics (2020) 19: 263-270).

Srisonphan et al. teach a vacuum channel FET including a source electrode, and a silicon oxide, a gate electrode, a silicon oxide, and a drain electrode, which are sequentially formed on the source electrode, in which charge carriers are emitted into a vacuum from side walls of the source electrode. In a case of an n-type FET, the source electrode is constituted by a p-type silicon substrate, and current flows between the source and the drain in such a manner that electrons in a two-dimensional electron system (2DES) and an inversion layer induced near the interface between the source electrode and silicon oxide on the source electrode by a gate voltage and a source-drain voltage are emitted into a vacuum from side walls of the source electrode and reach the drain electrode.

Khoshkbijari et al. teach a vacuum channel FET including an anode electrode, and a silicon oxide, a gate electrode, a silicon oxide, and a cathode electrode, which are sequentially formed on the anode electrode, in which electrons are emitted into a vacuum from side walls of the cathode electrode. The electrons are emitted from the side walls of the cathode electrode into the vacuum by FN tunneling caused by a gate voltage and a cathode-anode voltage.

SUMMARY

There have been demands for increasing a source-drain current at an ON operation in a vacuum channel FET. The vacuum channel FETs as taught by Srisonphan et al. and Khoshkbijari et al. described above, however, have a structure in which electrons are emitted only from side walls of the source electrode or the cathode electrode when electrons are emitted from the source electrode or the cathode electrode into the vacuum, and it is therefore difficult to increase the source-drain current.

The present invention has been made in view of the aforementioned circumstances, and an object thereof is to provide a vacuum channel field effect transistor, a producing method thereof, and a semiconductor device capable of increasing a source-drain current.

A vacuum channel field effect transistor according to the present invention includes: a semiconductor substrate; a first insulator on the semiconductor substrate; a gate electrode on the first insulator; a second insulator on the gate electrode; a drain electrode on the second insulator; and an impurity diffusion layer in a surface of the semiconductor substrate, the impurity diffusion layer being in contact with a side wall including side faces of the first insulator, the gate electrode, and the second insulator, wherein application of predetermined voltages to the impurity diffusion layer, the gate electrode, and the drain electrode causes charge carriers in the impurity diffusion layer to travel through a vacuum or air faced by the side wall to the drain electrode.

Another vacuum channel field effect transistor according to the present invention includes: a semiconductor substrate; a source electrode formed in a flat shape on the semiconductor substrate in a direction perpendicular to a surface of the semiconductor substrate; a drain electrode formed in a flat shape in a direction perpendicular to the surface of the semiconductor substrate, the drain electrode facing the source electrode with a vacuum or air therebetween; and a gate electrode formed in a flat shape in a direction perpendicular to the surface of the semiconductor substrate, and facing the vacuum or air between the source electrode and the drain electrode, wherein application of predetermined voltages to the source electrode, the gate electrode, and the drain electrode causes charge carriers in the source electrode to travel through the vacuum or air to the drain electrode.

A method for producing a vacuum channel field effect transistor according to the present invention includes: a step of forming a first insulator on a semiconductor substrate; a step of forming a gate electrode on the first insulator; a step of forming a second insulator on the gate electrode; a step of forming a side wall including side faces of the first insulator, the gate electrode, and the second insulator; a step of forming an impurity diffusion layer in a surface of the semiconductor substrate in contact with the side wall; and a step of forming a drain electrode on the second insulator.

A semiconductor device according to the present invention includes a plurality of field effect transistors each including: a semiconductor substrate; a first insulator on the semiconductor substrate; a gate electrode on the first insulator; a second insulator on the gate electrode; a drain electrode on the second insulator; and an impurity diffusion layer in a surface of the semiconductor substrate, the impurity diffusion layer being in contact with a side wall including side faces of the first insulator, the gate electrode, and the second insulator, wherein application of predetermined voltages to the impurity diffusion layer, the gate electrode, and the drain electrode causes charge carriers in the impurity diffusion layer to travel through a vacuum or air faced by the side wall to the drain electrode, and the field effect transistors include an n-type field effect transistor in which the impurity diffusion layer is an n-type impurity diffusion layer and the charge carriers are electrons, and a p-type field effect transistor in which the impurity diffusion layer is a p-type impurity diffusion layer and the charge carriers are holes.

The present invention can provide a vacuum channel field effect transistor, a producing method thereof, and a semiconductor device including an impurity diffusion layer as a source electrode, which enables increase in a source-drain current.

DETAILED DESCRIPTION

First Embodiment

Figure 1:
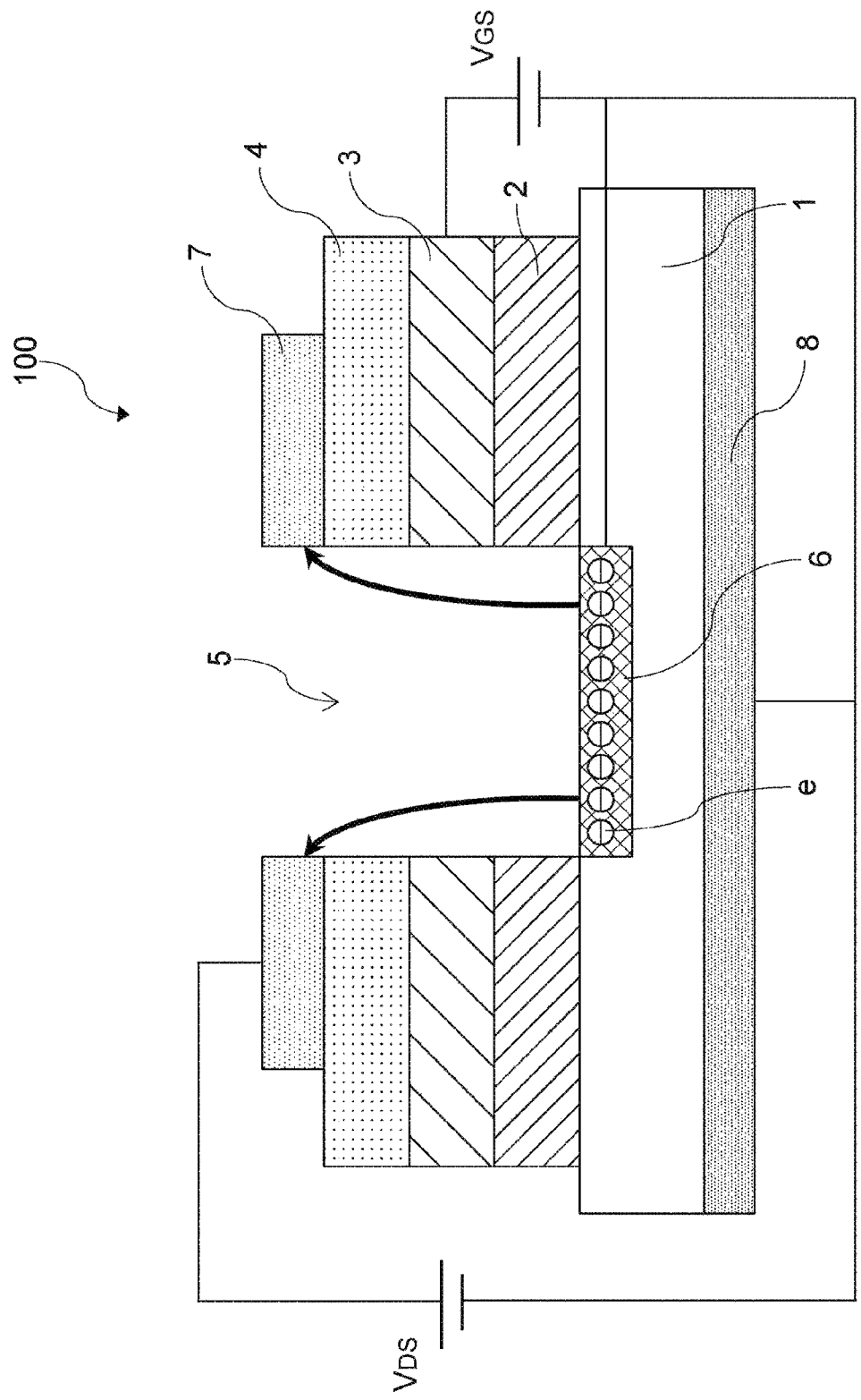
FIG. 1 is a cross-sectional view illustrating a structure of an FET according to a first embodiment of the present invention.

A vacuum channel field effect transistor 100 (hereinafter referred to as an FET 100) according to a first embodiment of the present invention will be described with reference to FIGS. 1 to 3. FIG. 1 is a cross-sectional view along a position A-A' in a plan view of FIG. 2. FIG. 3 is a perspective view of a cross section along the position A-A' in the plan view of FIG. 2 as viewed from above.

Figure 2:
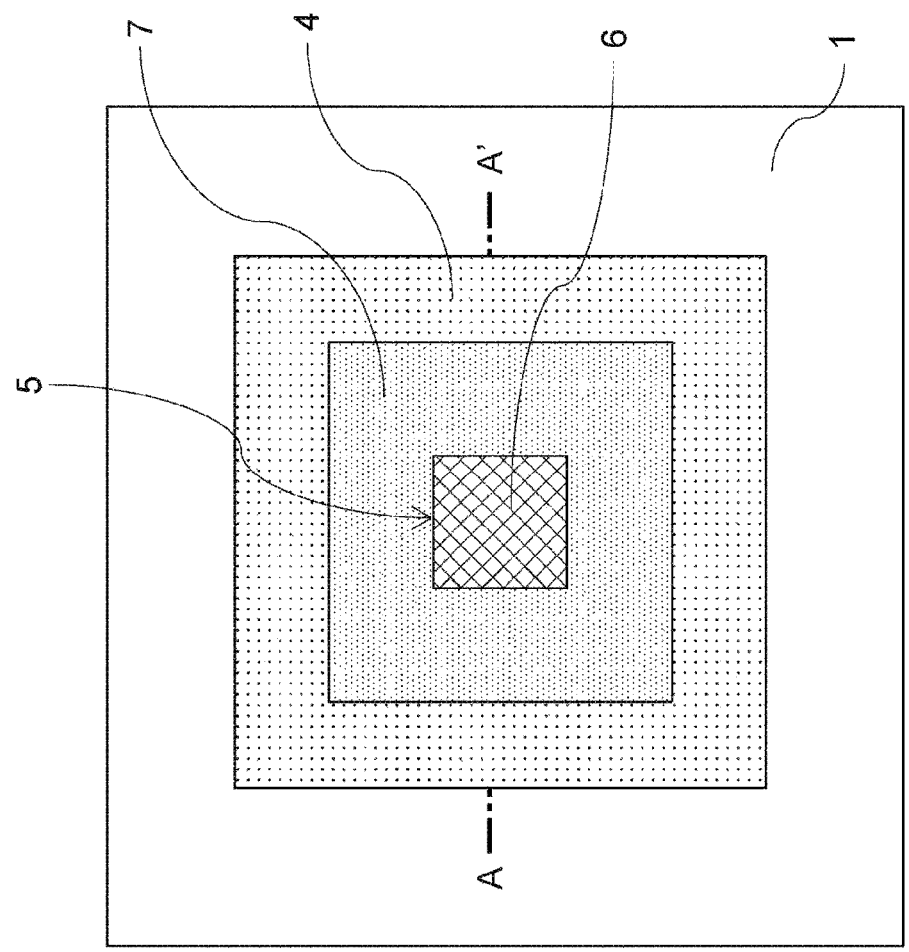
FIG. 2 is a plan view illustrating the structure of the FET according to the first embodiment of the present invention.
Figure 3:
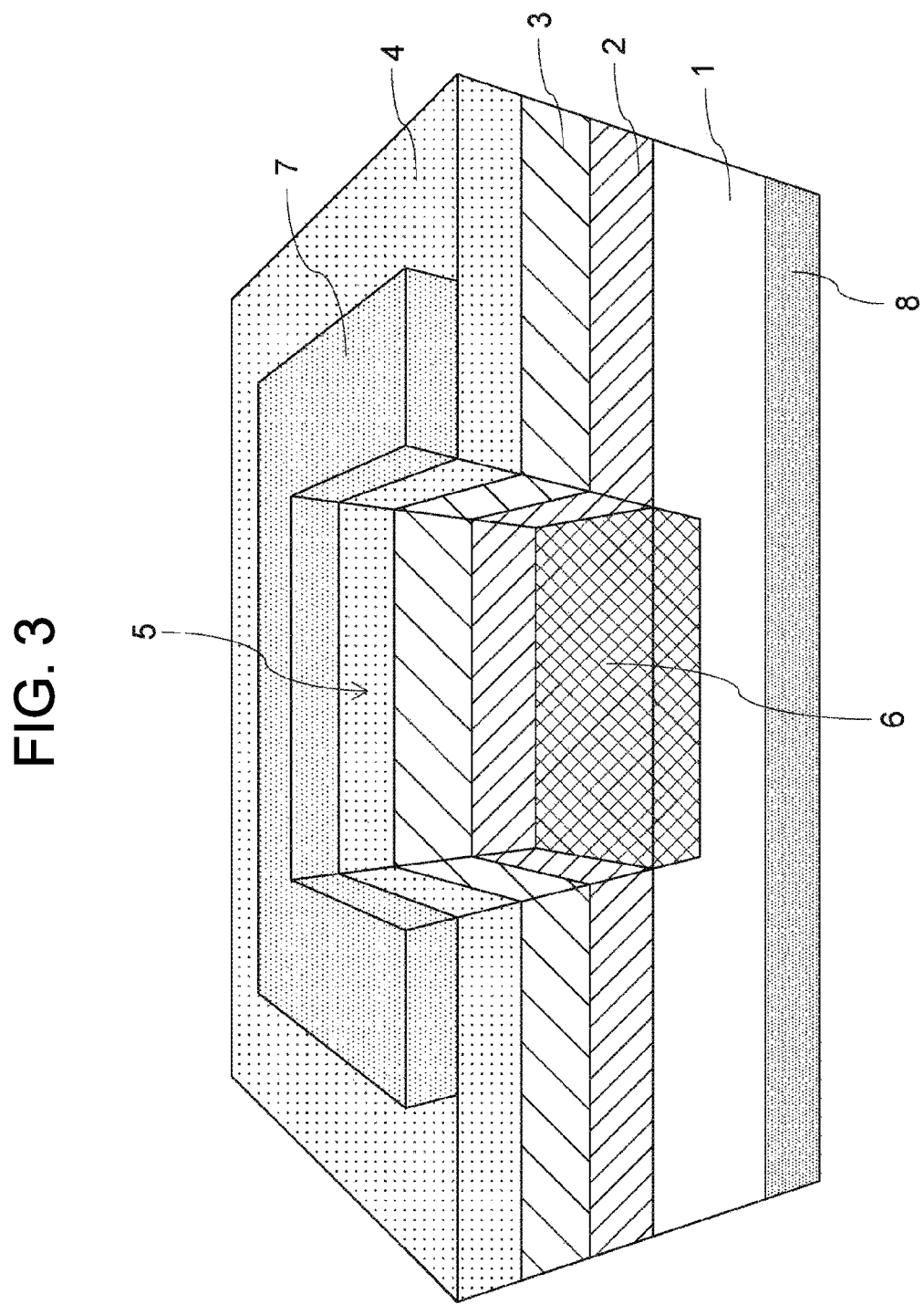
FIG. 3 is a cross-sectional perspective view illustrating the structure of the FET according to the first embodiment of the present invention.

In FIGS. 1 to 3, the FET 100 of the first embodiment is an n-type FET, and a first insulator 2, a gate electrode 3, a second insulator 4, and a drain electrode 7 are sequentially formed on a p-type semiconductor substrate 1. In addition, an opening 5 extending through the second insulator 4, the gate electrode 3, and the first insulator 2 and to the p-type semiconductor substrate 1 is formed. An n+ impurity diffusion layer 6 that functions as a source electrode is formed in the p-type semiconductor substrate 1 in the opening 5. Side faces of the first insulator 2, the gate electrode 3, and the second insulator 4 are exposed at each of four side walls of the opening 5, and the four side walls are in contact with the n+ impurity diffusion layer 6. A backside electrode 8 is formed on a backside of the p-type semiconductor substrate 1. A voltage source capable of supplying a positive voltage is connected with the gate electrode 3 and drain electrode 7, and a voltage source capable of supplying a negative voltage is connected with the n+ impurity diffusion layer 6 and the backside electrode 8.

In the FET 100, the direction of a vacuum channel is a direction perpendicular to the surface of the n+ impurity diffusion layer 6 (the vertical direction in FIG. 1).

In a case where the p-type semiconductor substrate 1 is a p-type silicon substrate, the n+ impurity diffusion layer 6 is formed at the bottom face of the opening 5 by implanting As (arsenic) or P (phosphorus), which is an n-type impurity into the p-type semiconductor substrate 1, and performing heat treatment. The n+ impurity diffusion layer 6 preferably covers the entire bottom face of the opening 5 and is in contact with the first insulator 2, but may extend to the outer side of the side faces of the opening 5 and be in contact with the bottom of the first insulator 2. In addition, the n+ impurity diffusion layer 6 need not necessarily cover the entire bottom face of the opening 5 as far as the FET operation is not affected.

The first insulator 2 has a thickness equal to or larger than 2 nm and equal to or smaller than 20 nm, for example, and the material thereof may be silicon oxide obtained by oxidizing the surface of the p-type semiconductor substrate 1 or silicon oxide obtained by deposition by a CVD method or the like, for example, in a case where the p-type semiconductor substrate 1 is a p-type silicon substrate. The second insulator 4 has a thickness equal to or larger than 10 nm and equal to or smaller than 20 nm, for example, and may be an insulator including silicon oxide or silicon nitride obtained by deposition by the CVD method or the like, for example.

The first insulator 2 and the second insulator 4 need not have the same thickness, and the first insulator 2 is preferably formed to be thinner than the second insulator 4, as will be described later. In this case, the thickness of the first insulator 2 may be equal to or larger than 2 nm and equal to or smaller than 10 nm, and the thickness of the second insulator 4 may be equal to or larger than 15 nm and equal to or smaller than 30 nm, for example.

The gate electrode 3 is made of a conductor such as metal or polysilicon doped with an n-type impurity, and has a thickness equal to or larger than 10 nm and equal to or smaller than 20 nm, for example.

The drain electrode 7 is made of a conductor such as metal or polysilicon, and has a thickness equal to or larger than 50 nm and equal to or smaller than 200 nm, for example.

The backside electrode 8 is made of metal such as Al or a conducting layer such as an impurity diffusion layer, and has a thickness equal to or larger than 50 nm and equal to or smaller than 200 nm, for example. A substrate voltage of the p-type semiconductor substrate 1 of the FET 100 is applied to the backside electrode 8. In a case where an n-type diffusion layer for applying the substrate voltage to the p-type semiconductor substrate 1 is additionally provided on the surface of the p-type semiconductor substrate 1, the backside electrode 8 may be omitted.

The opening 5 may be a square with each side having a length equal to or larger than 0.05 µm and equal to or smaller than 0.5 µm, for example, in the plan view of FIG. 2. As illustrated in FIGS. 1 to 3, the n+ impurity diffusion layer 6 is formed at the bottom face of the opening 5, and the side faces of the first insulator 2, the gate electrode 3, and the second insulator 4 are exposed at each of four side walls of the opening 5.

(Operation Principle)

Next, the operation of the FET 100 will be explained. The FET 100 is an n-type FET, and a vacuum space in the opening 5 faced by the side walls including the first insulator 2, the gate electrode 3, and the second insulator 4 serves as a channel for electrons that are charge carriers (hereinafter, a vacuum space serving as a channel may be referred to as a vacuum channel space).

Emission of electrons into the vacuum channel space is caused by bringing a gate-source voltage $V_{GS}$ (may hereinafter be referred to as $V_{GS}$) to a predetermined voltage, and traveling of electrons after emission is caused by bringing a source-drain voltage $V_{DS}$ (may hereinafter be referred to as $V_{DS}$) to a predetermined voltage. Specifically, a positive voltage is applied to the vacuum channel space from the gate electrode 3 and a negative voltage or a GND voltage is applied to the n+ impurity diffusion layer 6, which is a source electrode, electrons in the n+ impurity diffusion layer 6 thus undergo Fowler-Nordheim (FN) tunneling through a vacuum potential barrier, and are thus emitted into the vacuum channel space. As indicated by arrows in FIG. 1, electrons are emitted from the n+ impurity diffusion layer 6, which is the source electrode, in a direction perpendicular to the surface of the n+ impurity diffusion layer 6 (the vertical direction in FIG. 1), that is, in the same direction as the vacuum channel. The electrons e emitted into the vacuum channel space are attracted by an electric field generated by $V_{DS}$ and reach the drain electrode 7.

In addition, a positive voltage is applied to the gate electrode 3, the surface of the p-type semiconductor substrate 1 in contact with the first insulator is thus depleted, and electrons in an inversion layer are accumulated. Because the n+ impurity diffusion layer 6 is in contact with the side walls of the opening 5, the electrons in the inversion layer and the n+ impurity diffusion layer 6 are connected with each other. Thus, application of a positive voltage or a GND voltage to the n+ impurity diffusion layer 6 causes the electrons in the inversion layer to flow into the n+ impurity diffusion layer 6. In this manner, the electrons in the inversion layer, in addition to the electrons in the n+ impurity diffusion layer 6 described above, can be used as charge carriers in the FET 100. In order to use the electrons in the inversion layer as charge carriers in the FET 100, it is preferable that the n+ impurity diffusion layer 6 be formed to extend to the p-type semiconductor substrate 1 in contact with the first insulator 2 and come in contact with the bottom face of the first insulator 2, so as to facilitate the flow of the electrons in the inversion layer into the n+ impurity diffusion layer 6.

For turning the FET 100 ON, 0 V, for example, may be applied to the n+ impurity diffusion layer 6, which is the source electrode, +2 V, for example, may be applied to the drain electrode 7, +1 V, for example, may be applied to the gate electrode 3, and 0 V, for example, may be applied to the backside electrode 8.

As described above, because the electrons are emitted by FN tunneling between the n+ impurity diffusion layer 6 and the vacuum, the positive voltage applied to the vacuum channel space by the gate electrode 3 is preferably applied near the interface between the n+ impurity diffusion layer 6 and the vacuum. Thus, the first insulator 2 is preferably formed to be thinner than the second insulator 4.

While the case in which the FET 100 is an n-type FET has been described above, the FET 100 can be a p-type FET by replacing the p-type semiconductor substrate 1 with an n-type semiconductor substrate or an n-well and replacing the n+ impurity diffusion layer 6 with a p-type impurity diffusion layer. In the case where the FET 100 is a p-type FET, holes serving as charge carriers are emitted from the p+ impurity diffusion layer into the vacuum channel space, travel through the vacuum channel space, and then reach the drain electrode 7. The emission of holes into the vacuum channel space is caused by bringing $V_{GS}$ to a predetermined voltage in a manner similar to the case where the FET 100 is an n-type FET, and the traveling after the emission is caused by bringing $V_{DS}$ to a predetermined voltage. Specifically, a negative voltage is applied to the vacuum channel space from the gate electrode 3 and a positive voltage or a GND voltage is applied to the p+ impurity diffusion layer, which is the source electrode, holes in the p+ impurity diffusion layer thus undergo FN tunneling through a vacuum potential barrier, and are thus emitted into the vacuum channel space. Holes are emitted from the p+ impurity diffusion layer, which is the source electrode, in a vertical direction (perpendicular direction) with respect to the p+ impurity diffusion layer, that is, in the same direction as the vacuum channel. The holes emitted into the vacuum channel space are caused to travel through the vacuum by an electric field generated by $V_{DS}$, and reach the drain electrode 7. In the case where the FET 100 is a p-type FET, the FET 100 can be turned on by applying 0 V, for example, to the p+ impurity diffusion layer, which is the source electrode, −2 V, for example, to the drain electrode 7, and −1 V, for example, to the gate electrode 3.

The FET 100 has a channel length L corresponding to the height from the n+ impurity diffusion layer 6 to the drain electrode 7, that is, a sum of the thicknesses of the first insulator 2, the gate electrode 3, and the second insulator 4. Because the mean free path of electrons in a vacuum is about 60 nm, the sum of the thicknesses of the first insulator 2, the gate electrode 3, and the second insulator 4 is preferably equal to or smaller than 60 nm.

The FET 100 has a channel width W depending on the perimeter length and the area of the opening 5. Thus, an increase in at least one of the perimeter length and the area of the opening 5 can increase the source-drain current $I_{DS}$. While the upper face and the lower face of the opening 5 are square in the description above and FIGS. 1 to 3, the present embodiment is not limited thereto, and the upper face and the lower face of the opening 5 may have a circular shape, an elliptical shape, a polygonal shape with three or more sides, a star shape, or the like so as to increase at least one of the perimeter length and the area.

While the whole internal space faced by the four side walls of the opening 5 is used as a channel in the FET 100 in the description above, the present embodiment is not limited thereto, and the number of side walls including the first insulator 2, the gate electrode 3, and the second insulator 4 may be at least one for one n+ impurity diffusion layer 6. In order to increase the source-drain current, the number of side walls for one n+ impurity diffusion layer 6 is preferably two or more.

While the inside of the opening 5 is described as being vacuum in the description above, the present embodiment is not limited thereto, and air may be present in the inside of the opening 5. In a case where the inside of the opening 5 is air, the mean free path of electrons in the air is shorter than that in a vacuum, and thus the aforementioned channel length L is preferably shorter than that in the case of a vacuum.

While a structure in which the FET 100 that is an n-type FET is formed on the p-type semiconductor substrate 1 has been described above, a p-n junction of the p-type semiconductor substrate 1 and the n+ impurity diffusion layer 6 does not directly contribute to the operation of the FET 100. In addition, parasitic capacitance and junction leakage caused by the p-n junction are also factors that degrade the high-speed performance and the reliability of the FET 100. Thus, a structure in which the n+ impurity diffusion layer 6, which is a source of emission of electrons, and another semiconductor layer do not form a p-n junction may be used; in this case, the high-speed performance and the reliability of the FET 100 can be improved. In a case where no p-n junction is formed, the first insulator 2, the gate electrode 3, and the second insulator 4 may be sequentially formed on an n-type semiconductor substrate or an n-well instead of a p-type semiconductor substrate 1 or a p-well, and the opening 5, the n+ impurity diffusion layer 6, the drain electrode 7, and the backside electrode 8 may be subsequently formed, for example.

In the case where the FET 100 is a p-type FET as well, a structure in which the p-type impurity diffusion layer, which is a source of emission of holes, and another semiconductor layer do not form a p-n junction may be used for the same reason as in the case where the FET 100 is an n-type FET. In this case, the first insulator 2, the gate electrode 3, and the second insulator 4 may be sequentially formed on a p-type semiconductor substrate or a p-well instead of an n-type semiconductor substrate or an n-well, and the opening 5, the p+ impurity diffusion layer, the drain electrode 7, and the backside electrode 8 may be subsequently formed, for example.

(Producing Method)

Figure 4:
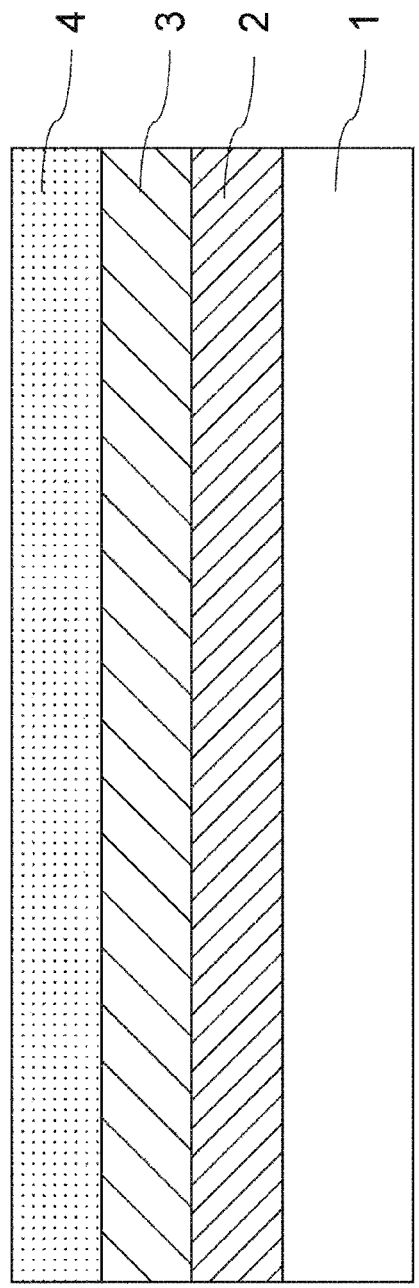
FIG. 4 is a cross-sectional view illustrating a stage of a method for producing the FET according to the first embodiment of the present invention at a point where a second insulator is formed.

Next, an example of a method for producing the FET 100 in the case where a silicon substrate is used for the p-type semiconductor substrate 1 will be explained. First, as illustrated in FIG. 4, silicon oxide is formed as the first insulator 2 with a thickness of 20 nm, for example, on the surface of the p-type semiconductor substrate 1 by the thermal oxidation method. Subsequently, a P (phosphorus)-doped polysilicon layer is formed as the gate electrode 3 with a thickness of 20 nm, for example, on the first insulator 2 by the CVD method. Subsequently, silicon oxide is formed as the second insulator 4 with a thickness of 20 nm, for example, on the gate electrode 3 by a plasma CVD method. A cross-sectional view at this point is illustrated in FIG. 4.

Subsequently, a photoresist (not illustrated), in which a region other than the region in which the FET 100 is to be formed is open and a region in which the opening 5 is to be formed (see FIG. 2) is open, is formed on the second insulator 4 by a photolithography method. Subsequently, the photoresist is used as a mask, the second insulator 4, the gate electrode 3, and the first insulator 2 that are exposed are removed by a dry etching method, and the opening 5 is thus formed.

Figure 5:
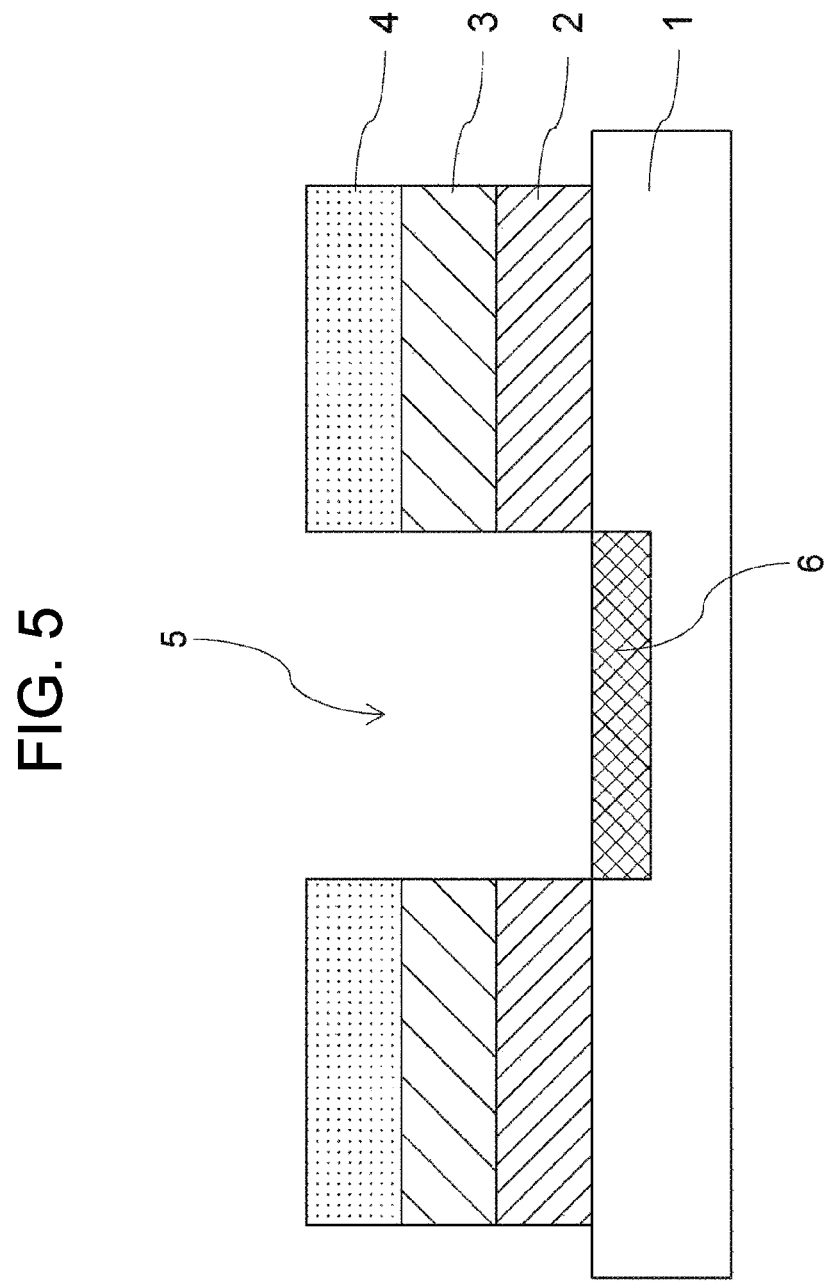
FIG. 5 is a cross-sectional view illustrating a stage of the method for producing the FET according to the first embodiment of the present invention, at a point where an n+ impurity diffusion layer is formed.

Subsequently, As (arsenic) ions are implanted into the p-type semiconductor substrate 1 in the opening 5 by an ion implantation method to form the n+ impurity diffusion layer 6, and the photoresist is then removed. A cross-sectional view at this point is illustrated in FIG. 5.

Subsequently, Al (aluminum) is formed with a thickness of 100 nm, for example, by a sputtering method, and the formed Al is processed into the shape of the drain electrode 7 by the photolithography method and the dry etching method. As illustrated in FIGS. 1 to 3, the drain electrode 7 is formed on the second insulator 4. Subsequently, Al is formed with a thickness of 200 nm, for example, on the backside of the p-type semiconductor substrate 1 by the sputtering method. The FET 100 illustrated in FIG. 1 can thus be produced through the processes described above.

While the opening 5 is formed by the photolithography method and the dry etching method in the description above, the present embodiment is not limited thereto. The opening 5 may be formed by dry etching using Ga (gallium) ions by using a focused ion beam (FIB) device without using the photolithography method, for example. In addition, while it is described that Al to be the drain electrode 7 and the backside electrode 8 is formed by the sputtering method, Ga may be deposited by the FIB device, for example, instead of Al. In addition, a p-well doped with a p-type impurity may be formed as necessary in the p-type semiconductor substrate 1.

(Effects)

In a conventional vacuum channel FET, charge carriers are emitted in a direction perpendicular to the direction of a vacuum channel only from side walls of a source electrode or a cathode electrode. It is therefore difficult to increase the source-drain current. In addition, increasing the thickness of the source electrode or the cathode electrode to increase the area of the side walls, which are a source of emission of charge carriers, in the conventional vacuum channel FET causes a problem in that the vertical size of the FET increases. In contrast, in the FET 100 of the present embodiment, electrons that are charge carriers are emitted into the vacuum from the n+ impurity diffusion layer 6 on the surface of the p-type semiconductor substrate 1 in the direction perpendicular to the surface of the n+ impurity diffusion layer 6. Because the impurity diffusion layer is used as the source of emission of charge carriers, the area of the source of emission of charge carriers can be made larger than that of the side walls of the source electrode or the cathode electrode in the conventional art, which allows the amount of emission of charge carriers to be increased as compared with the conventional art. Furthermore, charge carriers in the inversion layer in the surface of the semiconductor substrate 1 in contact with the first insulator 2 can be emitted into the vacuum via the impurity diffusion layer, which allows the amount of emission of charge carriers to be increased as compared with the conventional art. In addition, because charge carriers in the FET 100 are emitted from the impurity diffusion layer in the same direction as the direction of the vacuum channel (a direction parallel to the vacuum channel), charge carriers can be emitted more efficiently than in the conventional art. Consequently, a high-performance vacuum channel FET capable of increasing the source-drain current as compared with the conventional art can be achieved.

Second Embodiment

While a case where the vacuum channel field effect transistor is an n-type FET and a case where the vacuum channel field effect transistor is a p-type FET are described in the first embodiment, a semiconductor device including a complementary FET circuit, in which an n-type FET and a p-type FET are formed on one semiconductor substrate, may be formed.

Figure 6:
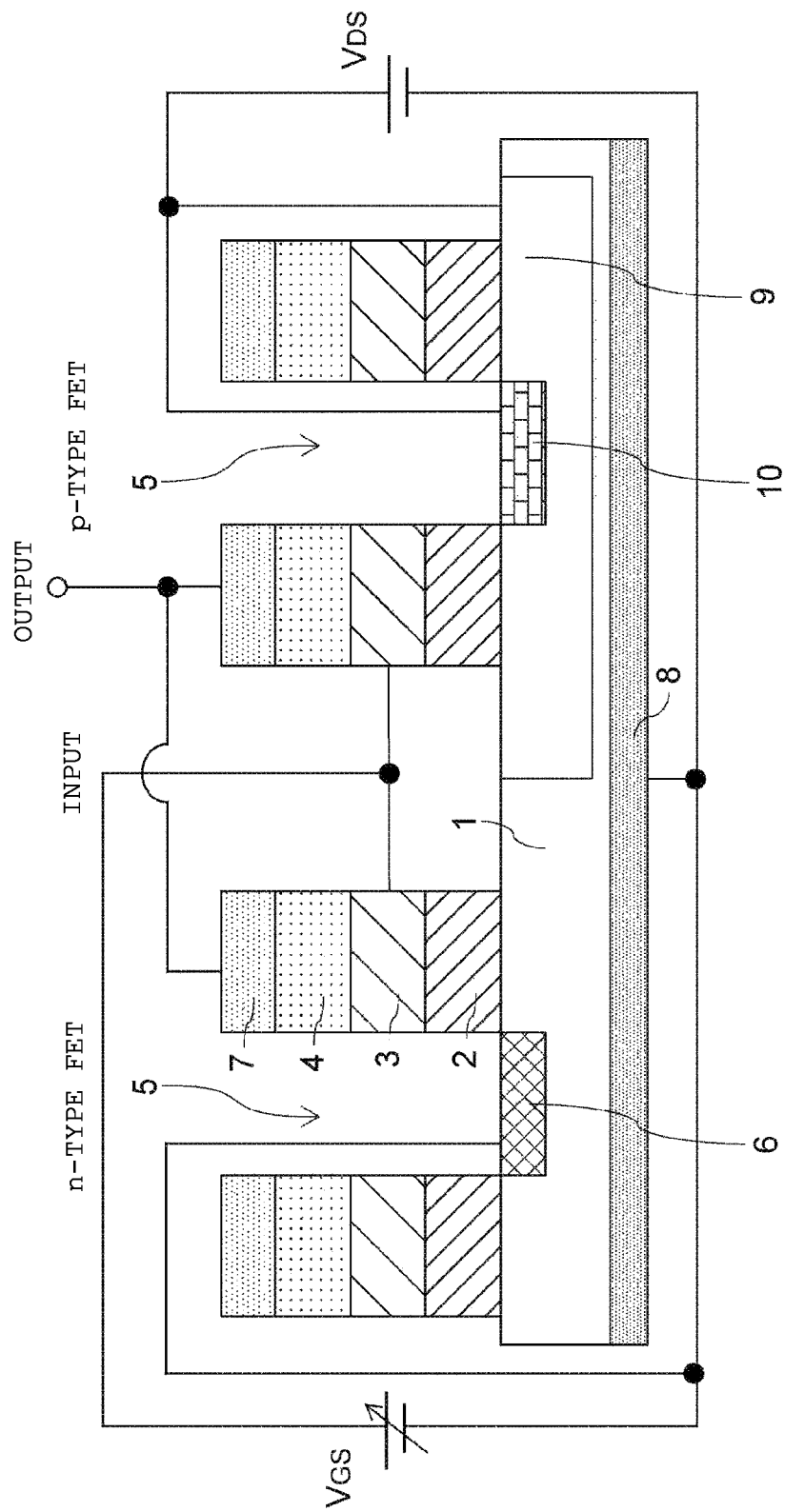
FIG. 6 is a cross-sectional view illustrating a structure of an FET circuit according to a second embodiment of the present invention.

As illustrated in FIG. 6, a vacuum channel field effect transistor circuit 110 (hereinafter referred to as an FET circuit 110) of a second embodiment is a complementary FET circuit including an n-type FET and a p-type FET. Components that are the same as those in the first embodiment will be denoted by the same reference numerals, and redundant description may not be repeated.

An n-type FET illustrated on the left in FIG. 6 has a structure similar to that of the FET 100 described in the first embodiment, in which a first insulator 2, a gate electrode 3, a second insulator 4, and a drain electrode 7 are sequentially formed on a p-type semiconductor substrate 1. In addition, an opening 5 extending through the second insulator 4, the gate electrode 3, and the first insulator 2 and to the p-type semiconductor substrate 1 is present. An n+ impurity diffusion layer 6 that functions as a source electrode is formed in the p-type semiconductor substrate 1 in the opening 5.

A p-type FET illustrated on the right in FIG. 6 has a structure similar to that of the FET 100 described in the first embodiment, in which the first insulator 2, the gate electrode 3, the second insulator 4, and the drain electrode 7 are sequentially formed on an n-well 9 obtained by doping the p-type semiconductor substrate 1 with an n-type impurity, and an opening 5 extending through the second insulator 4, the gate electrode 3, and the first insulator 2 and to the n-well 9 is present. A p+ impurity diffusion layer 10 that functions as a source electrode is formed in the n-well 9 in the opening 5.

A case where the FET circuit 110 is a complementary inverter circuit will be described as an example of the complementary FET circuit. As illustrated in FIG. 6, in the FET circuit 110, the gate electrodes 3 of the n-type FET and the p-type FET are connected with each other, and the drain electrodes 7 of the n-type FET and the p-type FET are connected with each other. The gate electrodes 3 of the n-type FET and the p-type FET are connected with a voltage source that supplies an input voltage to the complementary inverter circuit. An output voltage from the complementary inverter circuit is output to the outside through the drain electrodes 7 of the n-type FET and the p-type FET. A voltage source capable of supplying a negative voltage is connected with the n+ impurity diffusion layer 6 and the backside electrode 8, and a voltage source capable of supplying a positive voltage is connected with the p+ impurity diffusion layer 10 and the n-well 9.

For operation of the complementary inverter circuit, a GND voltage of 0 V, for example, is applied to the n+ impurity diffusion layer 6 of the n-type FET, and a positive voltage of +2 V, for example, is applied to the p+ impurity diffusion layer 10 of the p-type FET. A GND voltage, for example, is applied to the p-type semiconductor substrate 1 via the backside electrode 8. A positive voltage of +2 V, for example, is applied to the n-well 9. When a positive voltage of +2 V or a GND voltage of 0 V, for example, is applied, as an input signal input to the complementary inverter circuit, to the gate electrodes 3 of the n-type FET and the p-type FET in this state, an output voltage, which is an output signal from the complementary inverter circuit, is output to the outside from the drain electrodes 7 of the n-type FET and the p-type FET. Both of the p-type FET and the n-type FET are ON and current flows therethrough until the input signal voltage reaches the GND voltage or +2 V, and one of the p-type FET and the n-type FET is turned OFF and current does not flow after the input signal voltage reaches GND or +2 V. Thus, the FET circuit 110 is a low-power circuit that performs operation similar to that of a conventional CMOS inverter circuit.

Note that the example illustrated in FIG. 6 is an example in the case where the FET circuit 110 is a complementary inverter circuit, and various modifications can be made within the scope of the present invention. For example, the connection diagram in FIG. 6 can be modified as necessary, and each of the voltages applied to the gate electrode 3, the n+ impurity diffusion layer 6, the p+ impurity diffusion layer 10, the p-type semiconductor substrate 1, and the n-well 9 may be changed to a voltage supplied from another voltage source, and via another wiring and another circuit. In addition, the FET circuit 110 may be modified to another complementary FET circuit, such as a differential amplifier circuit, an SRAM circuit, or the like including a plurality of n-type FETs and p-type FETs. In addition, the input signal is not limited to the positive voltage of +2 V or 0 V, and a negative voltage may be applied instead of 0 V so as to increase the efficiency of emission of holes from the p+ impurity diffusion layer 10 of the p-type FET, for example.

(Producing Method)

Next, a method of producing the FET circuit 110 will be explained. First, a photoresist (not illustrated), in which only a region in which the p-type FET is to be formed is open, is formed on the p-type semiconductor substrate 1 by the photolithography method. Subsequently, P (phosphorus), which is an n-type impurity, is implanted into the p-type semiconductor substrate 1 by the ion implantation method, and the n-well 9 is thus formed. The subsequent method of sequentially forming the first insulator 2, the gate electrode 3, and the second insulator 4 on the surface of the p-type semiconductor substrate 1 is the same as that in the first embodiment, and the explanation thereof is therefore not repeated.

Subsequently, a photoresist, in which a region other than the regions in which the n-type FET and the p-type FET are to be formed in FIG. 6 is open and regions in which the openings 5 of the n-type FET and the p-type FET are to be formed in FIG. 6 are open, is formed on the second insulator by the photolithography method. Subsequently, the second insulator 4, the gate electrode 3, and the first insulator 2 are removed by the dry etching method using the photoresist as a mask, and the photoresist is then removed.

Subsequently, a photoresist, in which only a region in which the n-type FET is to be formed is open, is formed by the photolithography method, As (arsenic) ions are then implanted into the p-type semiconductor substrate 1 in the opening 5 of the n-type FET by the ion implantation method to form the n+ impurity diffusion layer 6, and the photoresist is then removed. Subsequently, a photoresist, in which only a region in which the p-type FET is to be formed is open, is formed by the photolithography method, B (boron) ions are then implanted into the n-well 9 in the opening 5 of the p-type FET by the ion implantation method to form the p+ impurity diffusion layer 10, and the photoresist is then removed. The method of sequentially forming the drain electrode 7 and the backside electrode 8 is the same as that in the first embodiment, and the explanation thereof is therefore not repeated.

(Effects)

As described above, according to the present embodiment, a semiconductor device including a complementary FET circuit in which an n-type FET and a p-type FET each including a vacuum channel are formed on one semiconductor substrate and which operates with low power can be achieved.

Third Embodiment

A vacuum channel field effect transistor 120 (hereinafter referred to as an FET 120) of a third embodiment differs from that in the first embodiment in including a side wall insulator 11 on side wall portions of the gate electrode 3, and the other components are the same as those in the first embodiment. Components that are the same as those in the first embodiment will be denoted by the same reference numerals, and redundant description may not be repeated.

Figure 7:
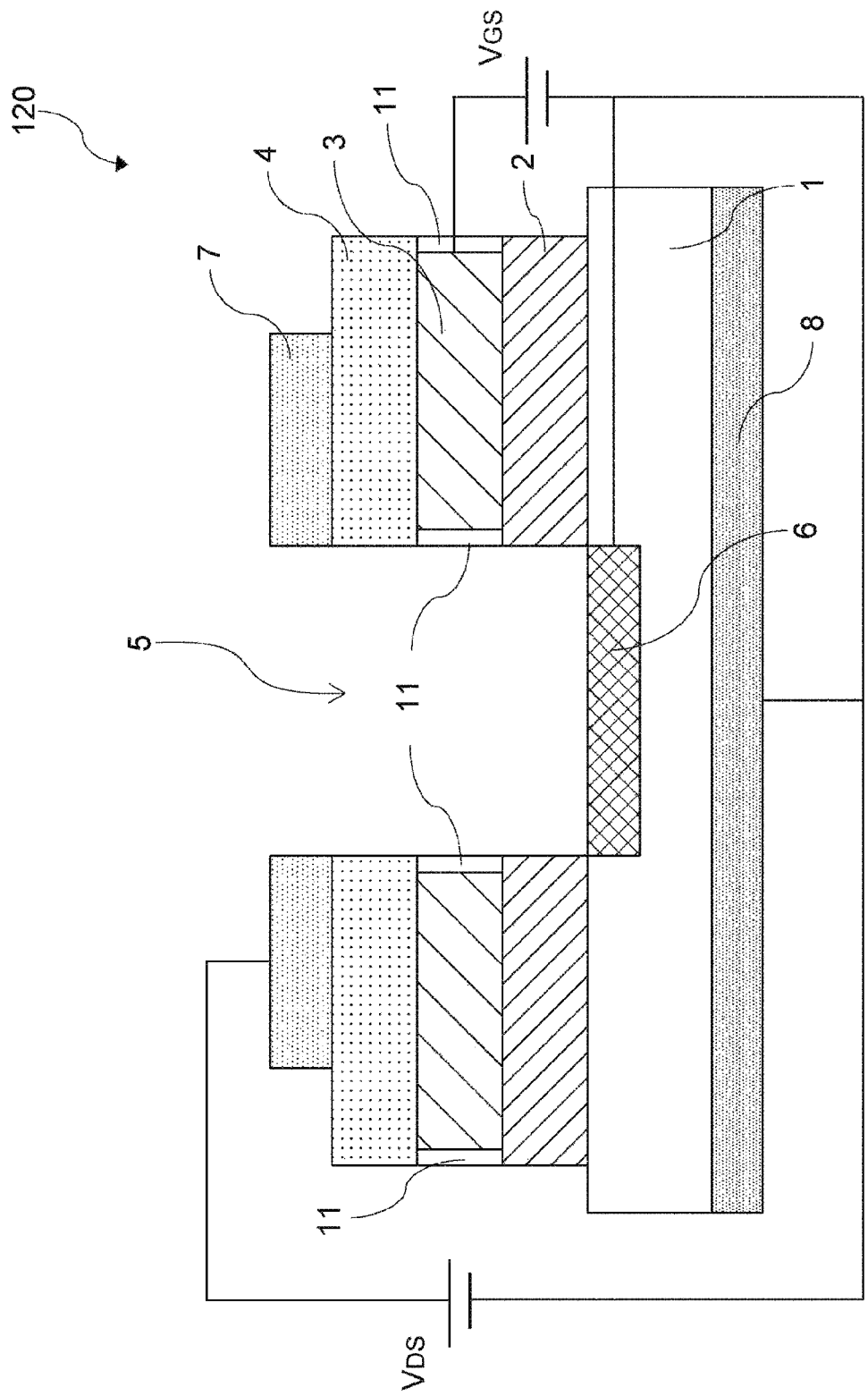
FIG. 7 is a cross-sectional view illustrating a structure of an FET according to a third embodiment of the present invention.
Figure 8:
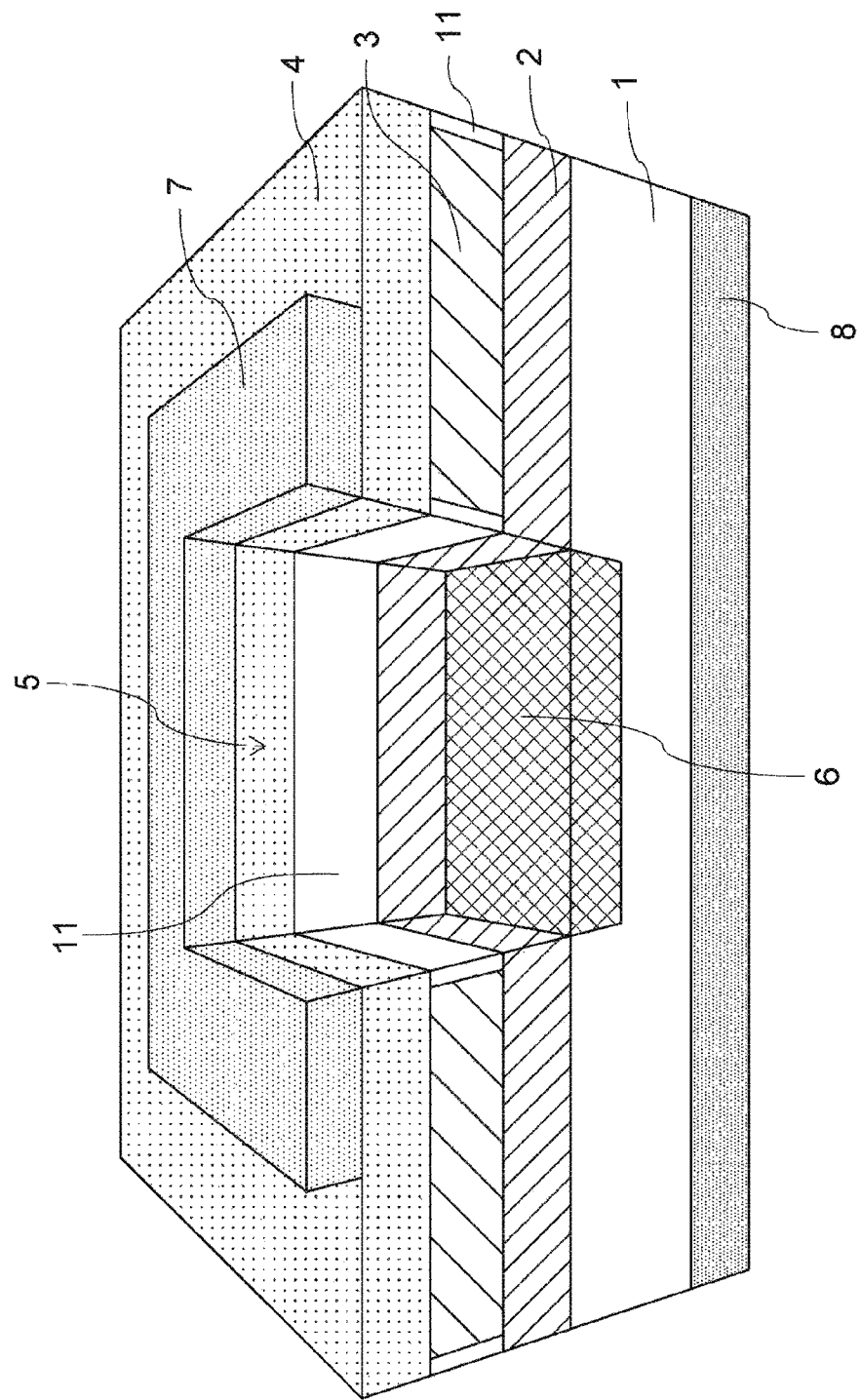
FIG. 8 is a cross-sectional perspective view illustrating the structure of the FET according to the third embodiment of the present invention.

As illustrated in FIGS. 7 and 8, the FET 120 of the third embodiment includes a side wall insulator 11 on side walls of the gate electrode 3. The side wall insulator 11 may be formed on at least side wall portions of the gate electrode 3 facing the opening 5. The side wall insulator 11 may be formed by thermally oxidizing polysilicon formed as the gate electrode 3, or by the CVD method or the sputtering method.

(Producing Method)

Next, a method of producing the FET 120 will be explained. The method of sequentially forming the first insulator 2, the gate electrode 3, and the second insulator 4 on the surface of the p-type semiconductor substrate 1 and subsequently forming the opening 5 and the n+ impurity diffusion layer 6 is the same as that in the first embodiment, and the explanation thereof is therefore not repeated.

For forming the side wall insulator 11 by thermal oxidation, the gate electrode 3 is formed of polysilicon doped with an n-type impurity and having a thickness equal to or larger than 10 nm and equal to or smaller than 20 nm. After the opening 5 is formed, the surface of the polysilicon of the exposed gate electrode 3 is thermally oxidized by the thermal oxidation method. Subsequently, a thermally oxidized layer formed simultaneously on the n+ impurity diffusion layer 6 by the thermal oxidation is removed by an anisotropic etching technique to form the side wall insulator 11 on the side walls of the gate electrode 3. The side wall insulator 11 has a thickness equal to or larger than 1 nm and equal to or smaller than 10 nm, for example. In a case where the side wall insulator 11 is formed by the CVD method or the sputtering method, the gate electrode 3 may be metal such as copper or tungsten instead of polysilicon. In a manner similar to the case of thermal oxidation, after the n+ impurity diffusion layer 6 is formed, silicon oxide, for example, is deposited by the CVD method. Subsequently, the silicon oxide deposited simultaneously on the n+ impurity diffusion layer 6 by the CVD is removed by the anisotropic etching technique to form the side wall insulator 11 on the side walls of the gate electrode 3. The subsequent method of sequentially forming the drain electrode 7 and the backside electrode 8 is the same as that in the first embodiment, and the explanation thereof is therefore not repeated.

(Effects)

In the present embodiment, the side wall insulator 11 is included on the side wall portions of the gate electrode 3, which can prevent part of electrons from being trapped on the gate electrode 3 to which a positive potential is applied while electrons travel through the vacuum space in the opening 5 from the n+ impurity diffusion layer 6 toward the drain electrode 7. Consequently, a high-performance vacuum channel FET capable of increasing the source-drain current $I_{DS}$ can be achieved.

Fourth Embodiment

A vacuum channel field effect transistor 130 (hereinafter referred to as an FET 130) of a fourth embodiment differs from that in the first embodiment in including a drain electrode 7 extending over the top of the opening 5, and the other components are the same as those in the first embodiment. Components that are the same as those in the first embodiment will be denoted by the same reference numerals, and redundant description may not be repeated.

Figure 9:
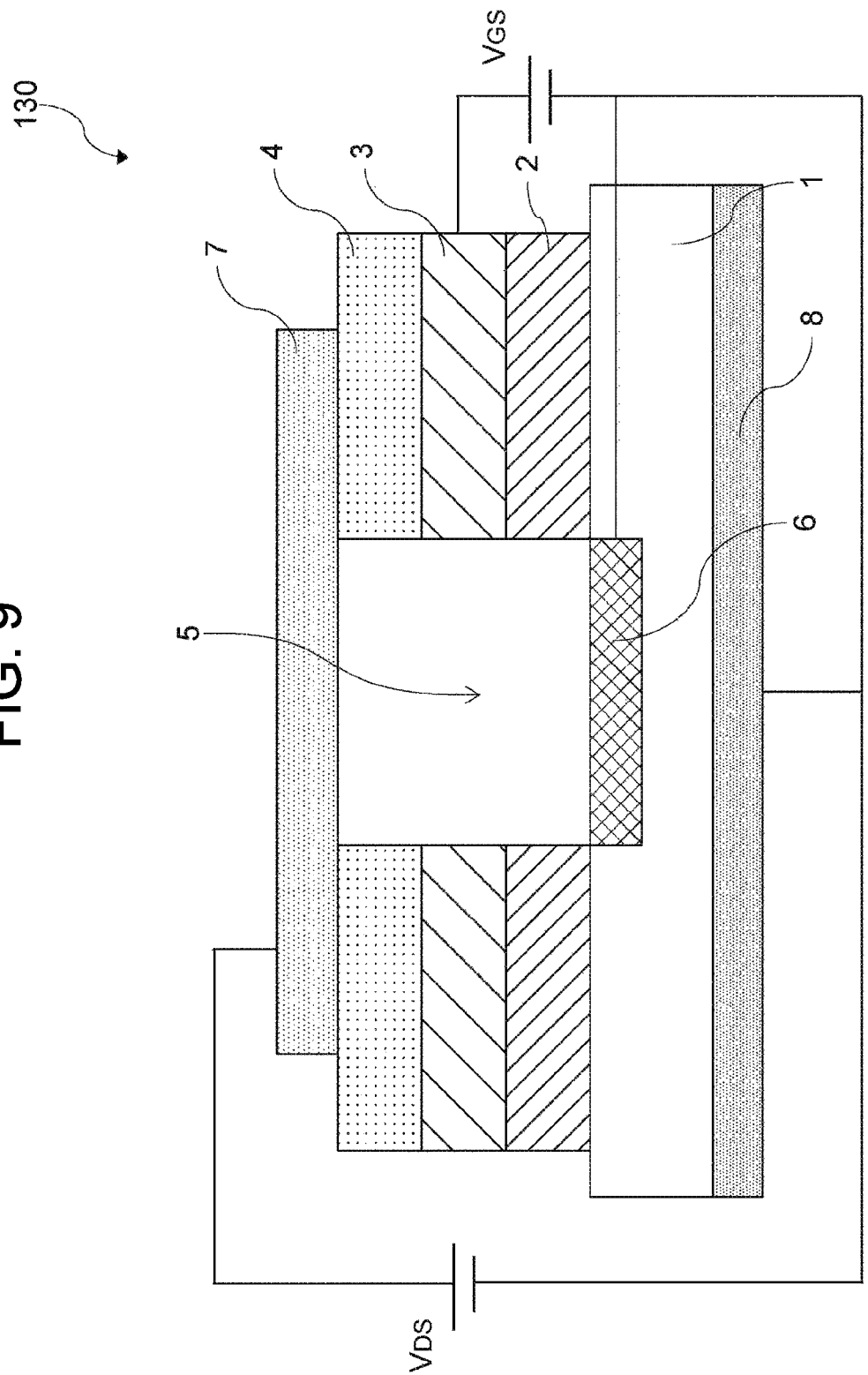
FIG. 9 is a cross-sectional view illustrating a structure of an FET according to a fourth embodiment of the present invention.

As illustrated in FIG. 9, in the FET 130 of the fourth embodiment, the drain electrode 7 is formed to cover the entire top of the opening 5. Alternatively, the drain electrode 7 may extend to the side of the n+ impurity diffusion layer 6 relative to the side walls of the second insulator 4 within a range that does not cover the entire top of the opening 5, to partially cover the top of the opening 5.

(Producing Method)

Next, a method of producing the FET 130 will be explained. The method of sequentially forming the first insulator 2, the gate electrode 3, and the second insulator 4 on the surface of the p-type semiconductor substrate 1 and subsequently forming the opening 5 and the n+ impurity diffusion layer 6 is the same as that in the first embodiment, and the explanation thereof is therefore not repeated.

After the n+ impurity diffusion layer 6 is formed, the focused ion beam (FIB) device is used to deposit Ga (gallium), which is a conductor, to cover the entire top or part of the top of the opening 5. The Ga deposition layer to be the drain electrode 7 may have a thickness equal to or larger than 50 nm and equal to or smaller than 200 nm, for example. Alternatively, after the n+ impurity diffusion layer 6 is formed, Al may be formed over the entire face with a thickness equal to or larger than 50 nm and equal to or smaller than 200 nm, for example, by the sputtering method, and the Al may then be patterned to cover the entire top or part of the top of the opening 5 by the photolithography method and the dry etching method.

(Effects)

Electrons emitted from the n+ impurity diffusion layer 6, which is the source electrode, travel through the vacuum space in the opening 5 toward the drain electrode 7. Because the drain electrode 7 extends to the side of the n+ impurity diffusion layer 6 relative to the side walls of the second insulator 4 to cover the entire top or part of the top of the opening 5, the number of electrons that reach the drain electrode 7 increases, and a high-performance vacuum channel FET capable of increasing the source-drain current $I_{DS}$ can therefore be achieved.

Fifth Embodiment

A vacuum channel field effect transistor circuit 140 (hereinafter referred to as an FET circuit 140) of a fifth embodiment is a complementary FET circuit formed on a silicon-on-insulator (SOI) substrate. Components that are the same as those in the first embodiment or the second embodiment will be denoted by the same reference numerals, and redundant description may not be repeated.

Figure 10:
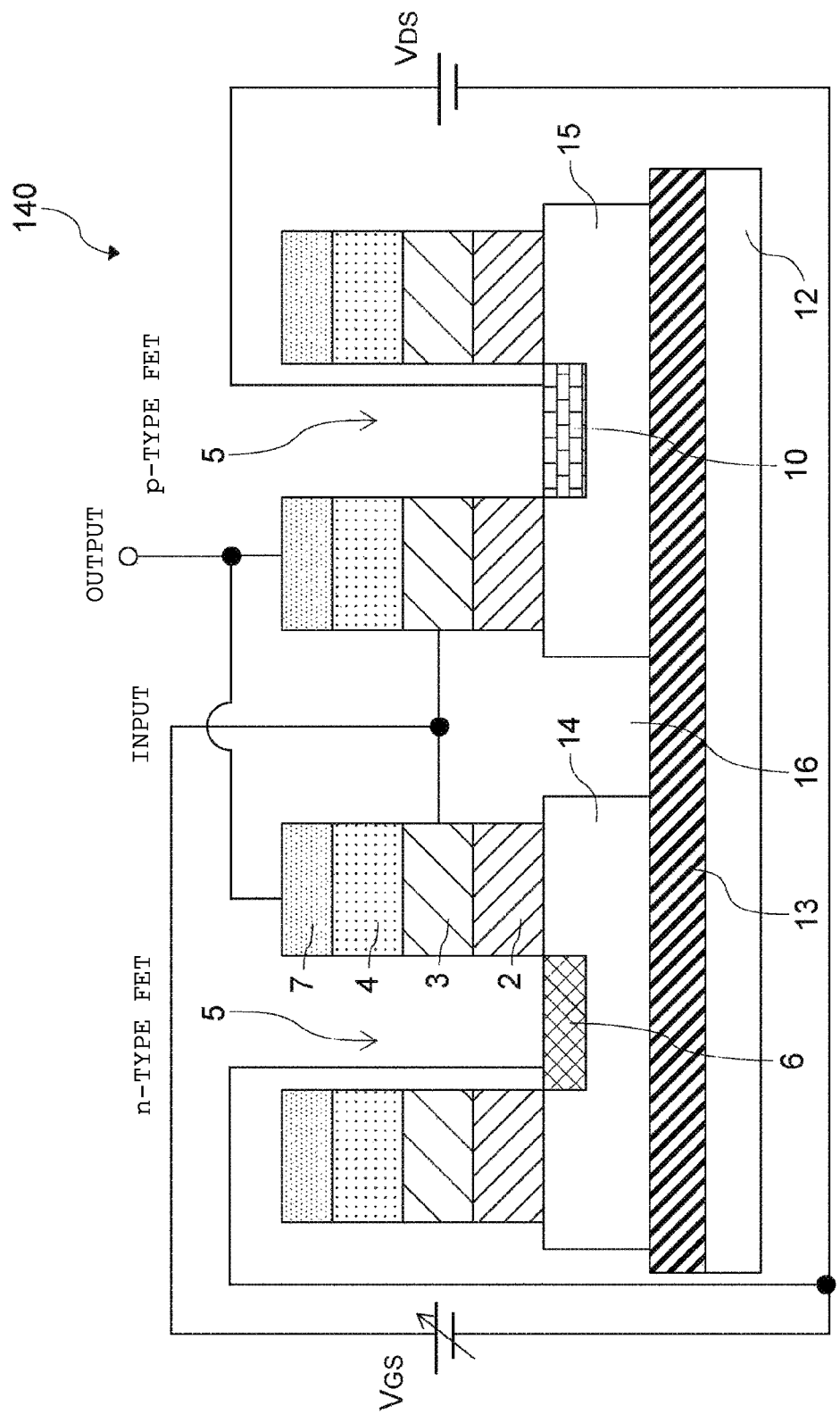
FIG. 10 is a cross-sectional view illustrating a structure of an FET circuit according to a fifth embodiment of the present invention.

As illustrated in FIG. 10, the FET circuit 140 of the fifth embodiment is a complementary FET circuit including an n-type FET and a p-type FET formed on an SOI substrate 5 including a supporting substrate 12, a buried silicon oxide layer 13, and an n-type active silicon layer 14.

The n-type FET illustrated on the left in FIG. 10 includes a first insulator 2, a gate electrode 3, a second insulator 4, and a drain electrode 7 sequentially formed on the n-type active silicon layer 14. In addition, an opening 5 extending through the second insulator 4, the gate electrode 3, and the first insulator 2 and to the n-type active silicon layer 14 is present. An n+ impurity diffusion layer 6 that functions as a source electrode is formed in the n-type active silicon layer 14 in the opening 5.

The p-type FET illustrated on the right in FIG. 10 includes the first insulator 2, the gate electrode 3, the second insulator 4, and the drain electrode 7 sequentially formed on a p-well 15 obtained by doping the n-type active silicon layer 14 with a p-type impurity. The bottom of the p-well 15 is on the buried silicon oxide layer 13. In addition, an opening 5 extending through the second insulator 4, the gate electrode 3, and the first insulator 2 and to the p-well 15 is present. A p+ impurity diffusion layer 10 that functions as a source electrode is formed in the p-well 15 in the opening 5. The n-type active silicon layer 14 and the p-well 15 are electrically isolated from each other by an element isolation region 16.

A case where the FET circuit 140 is a complementary inverter circuit will be described as an example of the complementary FET circuit formed on the SOI substrate. As illustrated in FIG. 10, in the FET circuit 140, the gate electrodes 3 of the n-type FET and the p-type FET are connected with each other, and the drain electrodes 7 of the n-type FET and the p-type FET are connected with each other. The gate electrodes 3 of the n-type FET and the p-type FET are connected with a voltage source that supplies an input voltage to the complementary inverter circuit. An output voltage from the complementary inverter circuit is output to the outside through the drain electrodes 7 of the n-type FET and the p-type FET. A voltage source capable of supplying a GND voltage is connected with the n+ impurity diffusion layer 6, and a voltage source capable of supplying a positive voltage is connected with the p+ impurity diffusion layer 10. Furthermore, a power supply capable of supplying a GND voltage may be connected with the n-type active silicon layer 14, and a voltage source capable of supplying a positive voltage may be connected with the p-well 15.

For operation of the complementary inverter circuit, a GND voltage of 0 V, for example, is applied to the n+ impurity diffusion layer 6 of the n-type FET, and a positive voltage of +2 V, for example, is applied to the p+ impurity diffusion layer 10 of the p-type FET. Furthermore, a positive voltage of +2 V, for example, may be applied to the p-well 15, and a GND voltage of 0 V, for example, may be applied to the n-type active silicon layer 14. When a positive voltage of +2 V or a GND voltage of 0 V, for example, is applied, as an input signal input to the complementary inverter circuit, to the gate electrodes 3 of the n-type FET and the p-type FET in this state, an output voltage, which is an output signal from the complementary inverter circuit, is output to the outside from the drain electrodes 7 of the n-type FET and the p-type FET. In this case as well, in a manner similar to a conventional CMOS inverter circuit including NMOS and PMOS transistors, current flows until the input signal reaches +2 V or the GND potential, but the current flowing through the circuit is 0 after the input signal has reached +2 V or the GND potential.

Note that the example illustrated in FIG. 10 is an example in the case where the FET circuit 140 is a complementary inverter circuit, and various modifications can be made within the scope of the present invention. For example, the connection diagram in FIG. 10 can be modified as necessary, and each of the voltages applied to the gate electrode 3, the n+ impurity diffusion layer 6, and the p+ impurity diffusion layer 10 may be changed to a voltage supplied from another voltage source, and via another wiring and another circuit. In addition, the FET circuit 140 may be modified to another complementary FET circuit, such as a differential amplifier circuit, an SRAM circuit, or the like including a plurality of n-type FETs and p-type FETs. In addition, the input signal is not limited to the positive voltage of +2 V or 0 V, and a negative voltage may be applied instead of 0 V so as to increase the efficiency of emission of holes from the p+ impurity diffusion layer 10 of the p-type FET, for example.

(Effects)

In the n-type FET of the FET circuit 140 of the present embodiment, the n+ impurity diffusion layer 6 that functions as the source electrode is formed in the n-type active silicon layer 14. The structure in which the n+ impurity diffusion layer 6 and another semiconductor layer do not form a p-n junction is used as described above, which can improve the high-speed performance and the reliability of the n-type FET of the FET circuit 140, as explained in the first embodiment. Similarly, in the p-type FET of the FET circuit 140, the p+ impurity diffusion layer 10 that functions as the source electrode is formed in the p-well 15. The structure in which the p+ impurity diffusion layer 10 and another semiconductor layer do not form a p-n junction is used as described above, which can improve the high-speed performance and the reliability of the p-type FET of the FET circuit 140. In addition, in the n-type FET of the FET circuit 140 of the present embodiment, because the n-type active silicon layer 14 of the n-type FET and the p-well 15 of the p-type FET are provided on the buried silicon oxide layer 13 of the SOI substrate, parasitic capacitance and junction leakage due to a p-n junction do not occur. Thus, the FET circuit 140 of the present embodiment is suitable for applications requiring resistance to radiation and resistance to high temperature for which it is difficult to use conventional MOS transistors.

Sixth Embodiment

A vacuum channel field effect transistor 150 (hereinafter referred to as an FET 150) of a sixth embodiment includes a structure for shielding a vacuum or air-filled space in the side face direction and the top face direction from external air by an insulator. The other components are the same as those in the first embodiment. Components that are the same as those in the first embodiment will be denoted by the same reference numerals, and redundant description may not be repeated. A technology for forming a hollow structure is described in U.S. Pat. No. 6,268,261 B1, for example.

Figure 11:
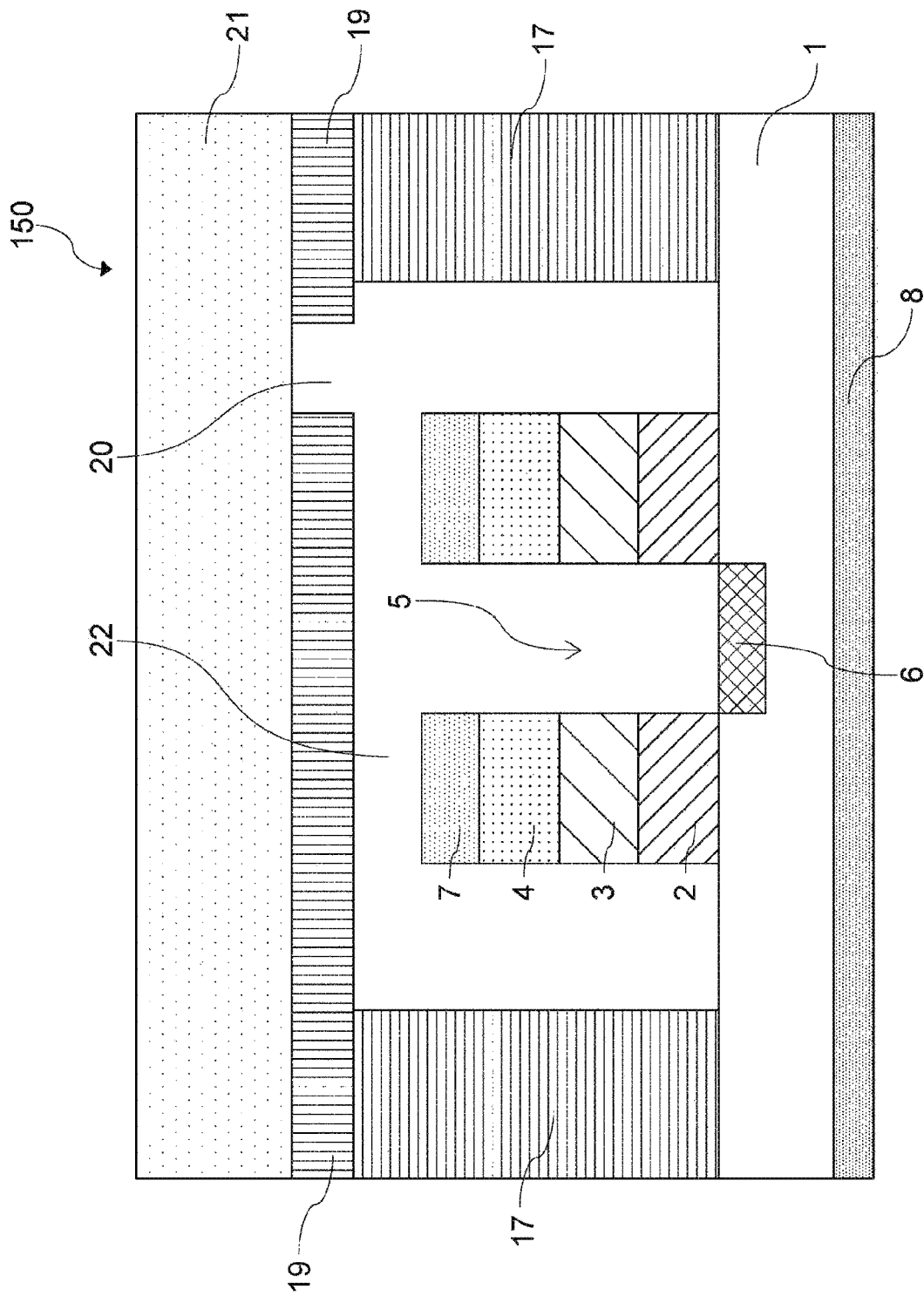
FIG. 11 is a cross-sectional view illustrating a structure of an FET according to a sixth embodiment of the present invention.

As illustrated in FIG. 11, the FET 150 of the sixth embodiment includes a first insulator 2, a gate electrode 3, a second insulator 4, and a drain electrode 7 sequentially formed on a p-type semiconductor substrate 1. In addition, an opening 5 extending through the second insulator 4, the gate electrode 3, and the first insulator 2 and to the p-type semiconductor substrate 1 is formed. An n+ impurity diffusion layer 6 that functions as a source electrode is formed in the p-type semiconductor substrate 1 in the opening 5. A backside electrode 8 is formed on a backside of the p-type semiconductor substrate 1. The other components are the same as those in the FET 100 of the first embodiment.

The FET 150 includes a hollow part 22, which is shielded from external air, around a layered structure including the first insulator 2, the gate electrode 3, the second insulator 4, and the drain electrode 7 (hereinafter may simply be referred to as a layered structure). The hollow part 22 is constituted by a space surrounded by a first cap layer 17, a second cap layer 19, and a cover layer 21. The first cap layer 17 is formed over the entire side face of the hollow part 22. The second cap layer 19 having a cap opening 20 and the cover layer 21 formed on the second cap layer 19 to cover the cap opening 20 are formed on the top face of the hollow part 22.

The first cap layer 17 is formed of silicon nitride, for example, and has a thickness equal to or larger than 80 nm and equal to or smaller than 200 nm, for example. The second cap layer 19 is formed of silicon nitride, for example, and has a thickness equal to or larger than 20 nm and equal to or smaller than 100 nm, for example. The cover layer 21 is formed of silicon oxide, for example, and has a thickness of equal to or larger than 100 nm and equal to or smaller than 500 nm, for example.

(Producing Method)

Next, an example of a method for producing the FET 150 will be explained. The method of sequentially forming the first insulator 2, the gate electrode 3, and the second insulator 4 on the surface of the p-type semiconductor substrate 1 and subsequently forming the opening 5, the n+ impurity diffusion layer 6, the drain electrode 7, and the backside electrode 8 is the same as that in the first embodiment, and the explanation thereof is therefore not repeated.

Subsequently, silicon nitride, silicon oxide, or the like is formed as the first cap layer 17 with a thickness equal to or larger than 80 nm and equal to or smaller than 200 nm, for example, by the CVD method. Subsequently, the first cap layer 17 is patterned by the photolithography method and the dry etching method. In this manner, the first cap layer 17 is formed to surround the entire perimeter in the side face direction of the layered structure including the first insulator 2, the gate electrode 3, the second insulator 4, and the drain electrode 7.

Figure 12:
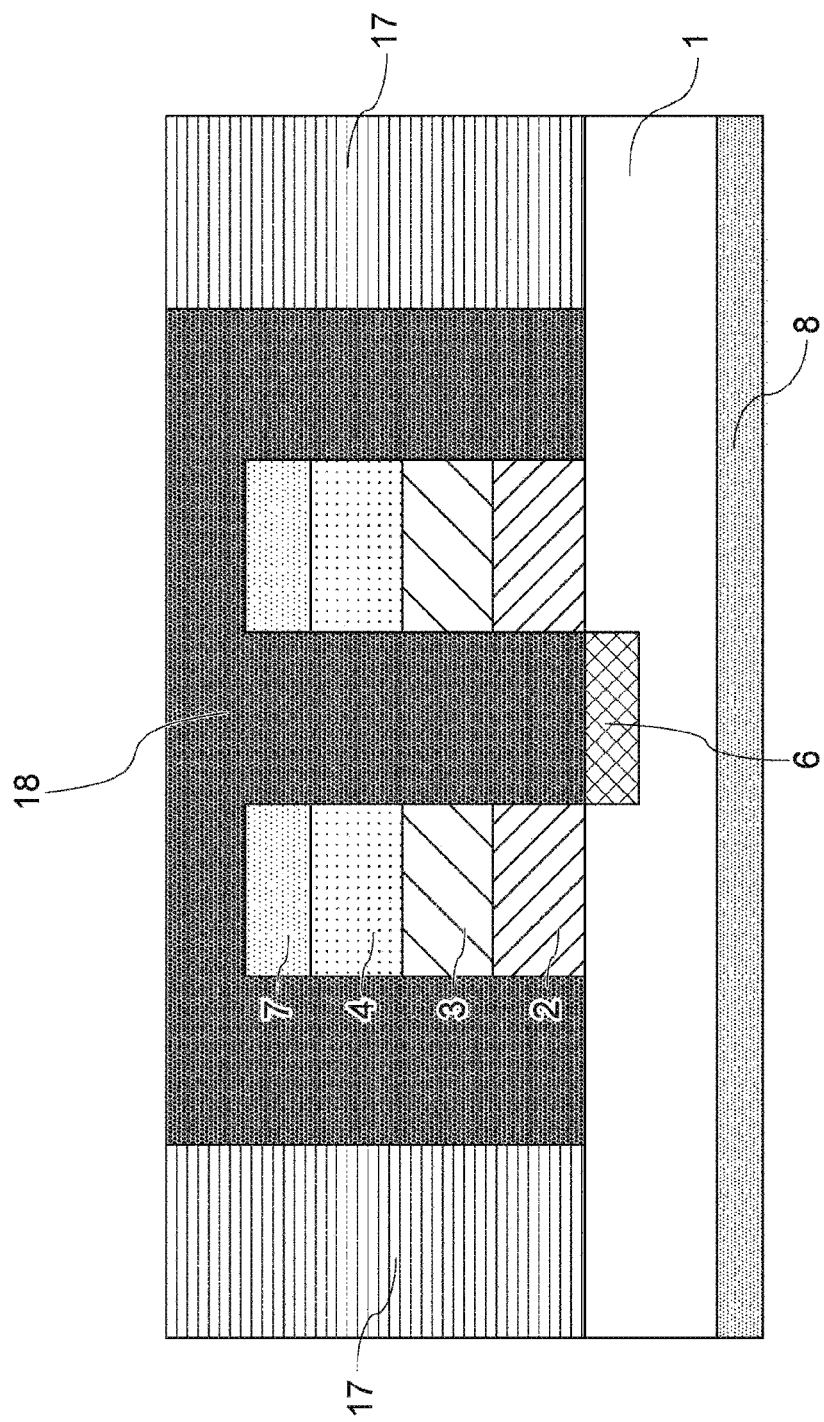
FIG. 12 is a cross-sectional view illustrating a stage of a method for producing the FET according to the sixth embodiment of the present invention at a point where a filler is formed.

Subsequently, a filler 18 is formed with a thickness equal to or larger than 100 nm and equal to or smaller than 400 nm, for example. For the filler, an amorphous carbon film may be formed by the sputtering method. Subsequently, the filler 18 on the first cap layer 17 is removed by a CMP method. As a result, the space between the first cap layer 17 and the layered structure is filled with the filler 18. A cross-sectional view at this point is illustrated in FIG. 12.

Figure 13:
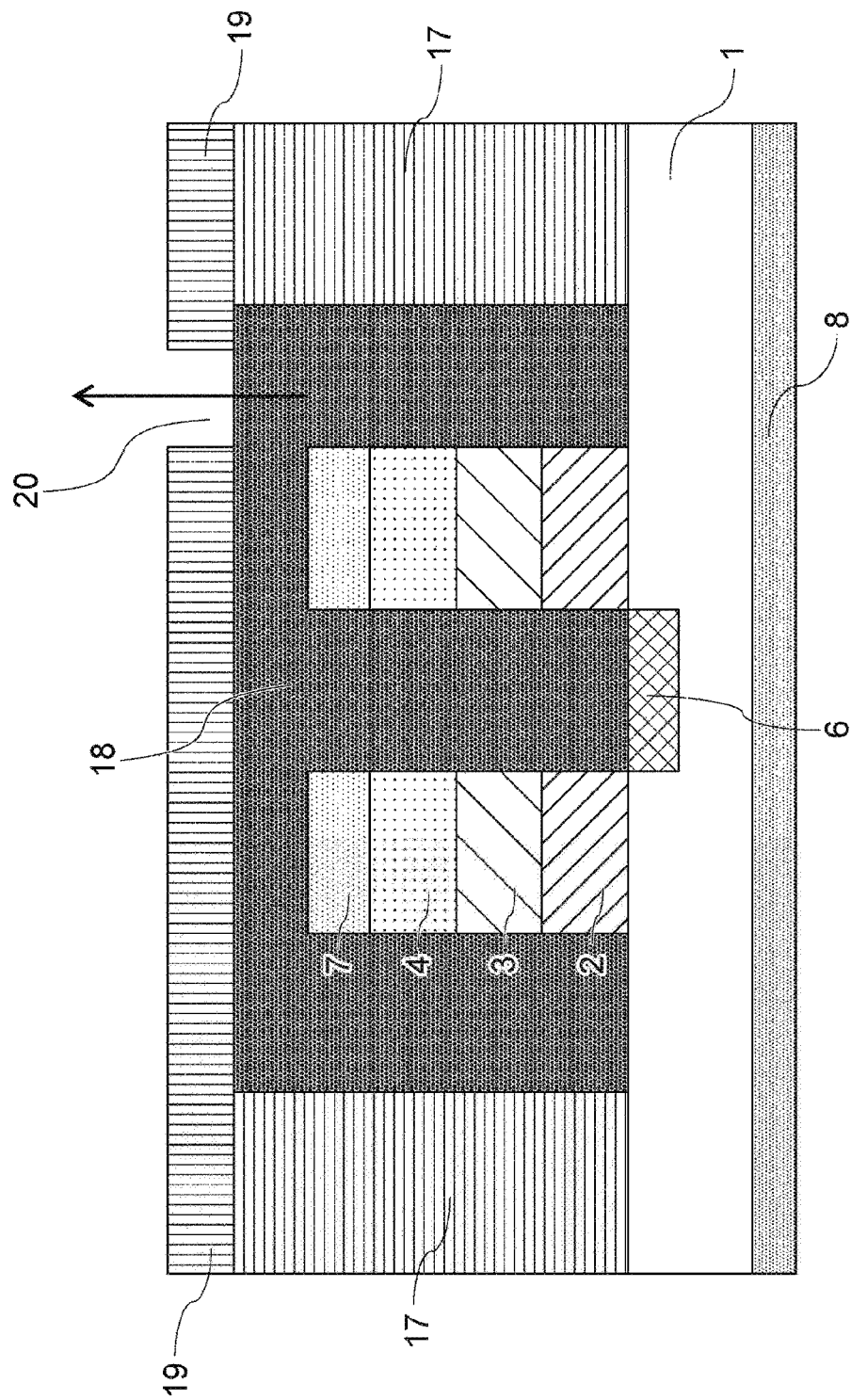
FIG. 13 is a cross-sectional view illustrating a stage of the method for producing the FET according to the sixth embodiment of the present invention at a point where a cap opening is formed.

Subsequently, silicon nitride or silicon oxide is formed as the second cap layer 19 with a thickness equal to or larger than 20 nm and equal to or smaller than 100 nm, for example, by the CVD method. Subsequently, the second cap layer 19 is patterned by the photolithography method and the dry etching method to form the cap opening 20 in part of the second cap layer 19, so that part of the surface of the filler 18 is exposed. Subsequently, in an atmosphere containing oxygen, heat treatment at 400° C. for two hours is performed, for example. The heat treatment gasifies the amorphous carbon, which is the filler 18, allowing release of the filler 18 to the outside through the cap opening 20 to remove the filler 18. FIG. 13 is a cross-sectional view at a point when the heat treatment is started, and the gasified amorphous carbon is released to the outside through the cap opening 20 as indicated by an arrow in FIG. 13.

Subsequently, silicon oxide is formed as the cover layer 21 with a thickness equal to or larger than 100 nm and equal to or smaller than 500 nm, for example, by the CVD method, to embed the cap opening 20, and the hollow part 22 is thus formed. The inside of the hollow part 22 may contain air or may be vacuum. Alternatively, inert gas such as nitrogen gas or argon gas may be injected into the hollow part 22.

(Effects)

Vacuum channel transistors are problematic in that the transistor performance degrades with time as a result of being exposed to external air because the internal space of the opening 5 is used as a vacuum channel. In the FET 150, the layered structure including the first insulator 2, the gate electrode 3, the second insulator 4, and the drain electrode 7 is placed in the hollow part 22 that is shielded from external air, which can reduce degradation with time in the performance and the reliability of vacuum channel transistors. Consequently, a high-performance and highly-reliable vacuum channel FET capable of increasing the source-drain current $I_{DS}$ can be achieved.

Seventh Embodiment

Figure 14:
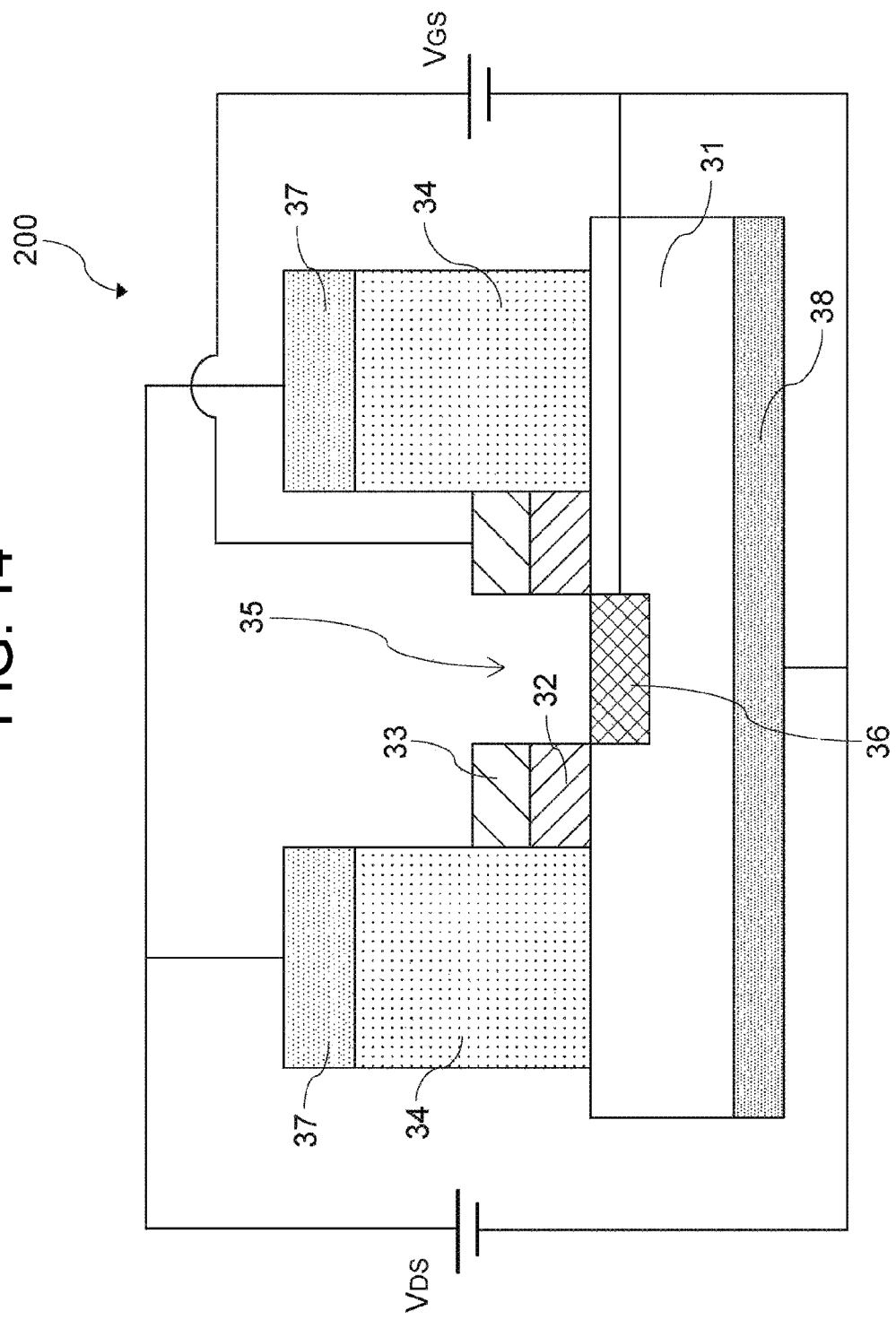
FIG. 14 is a cross-sectional view illustrating a structure of an FET according to a seventh embodiment of the present invention.
Figure 15:
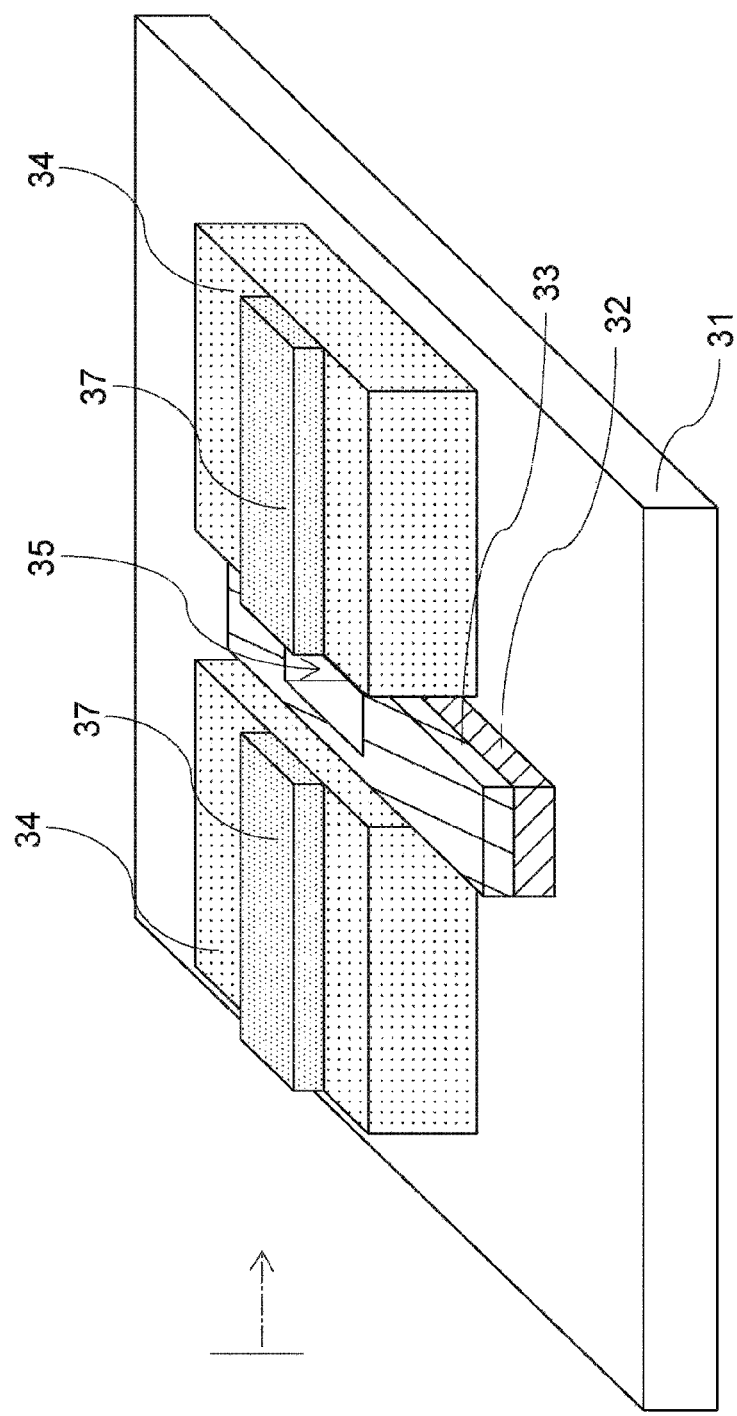
FIG. 15 is a perspective view illustrating the structure of the FET according to the seventh embodiment of the present invention.

A structure of a vacuum channel field effect transistor 200 (hereinafter referred to as an FET 200) of a seventh embodiment and a producing method thereof will be described with reference to FIGS. 14 to 19. FIG. 15 is a perspective view illustrating the entire structure of the FET 200, and FIG. 14 is a cross-sectional view along a direction indicated by an arrow in FIG. 15. In FIG. 15, a backside electrode 38 and wires connected to external terminals are not illustrated. In the description below, explanation overlapping with that in the first embodiment may not be repeated.

As illustrated in FIGS. 14 and 15, the FET 200 of the seventh embodiment includes a first insulator 32 and a second insulator 34 having a thickness larger than that of the first insulator 32, which are formed adjacent to each other on a p-type semiconductor substrate 31. A gate electrode 33 is present on the first insulator 32, and a drain electrode 37 is present on the second insulator 34. In addition, an opening 35 extending through the gate electrode 33 and the first insulator 32 and to the p-type semiconductor substrate 31 is formed. An n+ impurity diffusion layer 36 that functions as a source electrode is formed in the p-type semiconductor substrate 31 in the opening 35. A backside electrode 38 is formed on a backside of the p-type semiconductor substrate 31. A voltage source capable of supplying a positive voltage is connected with the gate electrode 33 and drain electrode 37, and a voltage source capable of supplying a negative voltage is connected with the n+ impurity diffusion layer 36 and the backside electrode 38.

In a case where the p-type semiconductor substrate 31 is a p-type silicon substrate, the n+ impurity diffusion layer 36 is formed by implanting As (arsenic) or P (phosphorus), which is an n-type impurity into the p-type semiconductor substrate 31, and performing heat treatment. The n+ impurity diffusion layer 36 preferably covers the entire bottom face of the opening 35 and is in contact with the first insulator 32, but may extend to the outer side of the side faces of the opening 35 and be in contact with the bottom of the first insulator 32. In addition, the n+ impurity diffusion layer 36 need not necessarily cover the entire bottom face of the opening 35 as far as the FET operation is not affected.

The first insulator 32 has a thickness equal to or larger than 5 nm and equal to or smaller than 20 nm, for example, and the material thereof may be silicon oxide obtained by oxidizing the surface of the p-type semiconductor substrate 31 or an insulator including silicon oxide or silicon nitride obtained by deposition by the CVD method or the like, for example, in a case where the p-type semiconductor substrate 31 is a p-type silicon substrate. The second insulator 34 has a thickness equal to or larger than 50 nm and equal to or smaller than 100 nm, for example, and may be an insulator including silicon oxide or silicon nitride obtained by deposition by the CVD method or the like, for example.

The gate electrode 33 is made of a conductor such as metal or polysilicon doped with an n-type impurity, and has a thickness equal to or larger than 10 nm and equal to or smaller than 20 nm, for example.

The drain electrode 37 is made of a conductor such as metal, polysilicon, or the like, and has a thickness equal to or larger than 50 nm and equal to or smaller than 200 nm, for example.

The backside electrode 38 is made of a conductor such as metal, such as Al, or polysilicon, and has a thickness equal to or larger than 50 nm and equal to or smaller than 200 nm, for example.

The opening 35 may have a rectangular shape with the short side having a length equal to or larger than 0.01 µm and equal to or smaller than 0.5 µm and the long side having a length equal to or larger than 0.02 µm and equal to or smaller than 5 µm, for example.

(Operation Principle)

Next, the operation of the FET 200 is similar to that in the first embodiment. For turning the FET 200 ON, 0 V, for example, is applied to the n+ impurity diffusion layer 36, which is the source electrode, +2 V, for example, is applied to the drain electrode 37, +1 V, for example, is applied to the gate electrode 33, and 0 V, for example, is applied to the backside electrode 38. When the voltages are applied as described above, FN tunneling occurs at the vacuum interface between the n+ impurity diffusion layer 36 and the inside of the opening 35, and electrons are emitted into the vacuum in the opening 35 from the surface of the n+ impurity diffusion layer 36. The emitted electrons travel through the vacuum toward the drain electrode 37, and reach the drain electrode 37.

(Producing Method)

Figure 16:
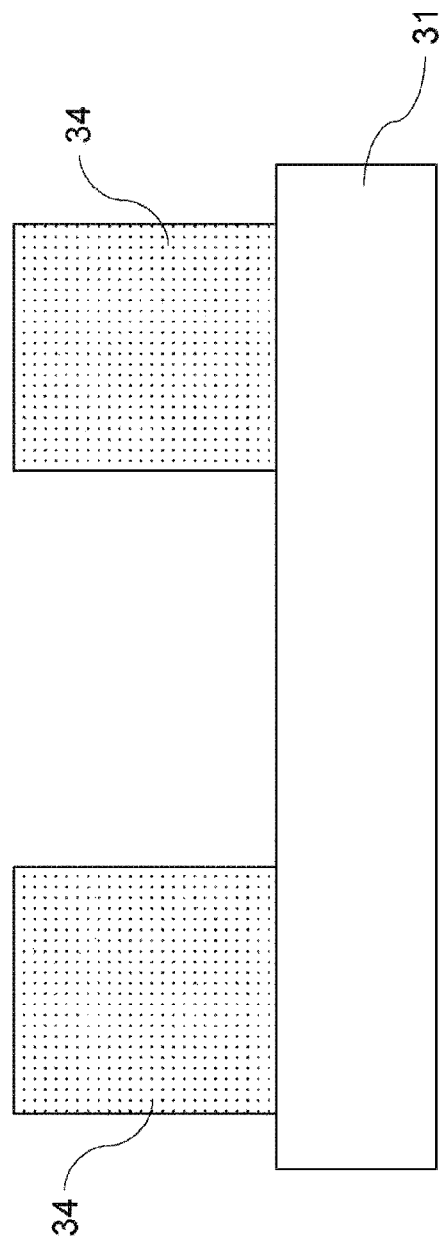
FIG. 16 is a cross-sectional view illustrating a stage of a method for producing the FET according to the seventh embodiment of the present invention at a point where a second insulator is formed.

Next, an example of a method for producing the FET 200 in the case where a p-type silicon substrate is used for the p-type semiconductor substrate 31 will be explained. After silicon oxide is formed as the second insulator 34 with a thickness of 80 nm, for example, on the surface of the p-type semiconductor substrate 31, the second insulator 34 is patterned by the photolithography method and the dry etching method using a photoresist as a mask. As illustrated in FIGS. 15 and 16, the second insulator 34 is constituted by two isolated patterns separated from each other. The second insulator 34 may be formed by the thermal oxidation method or the CVD method.

Figure 17:
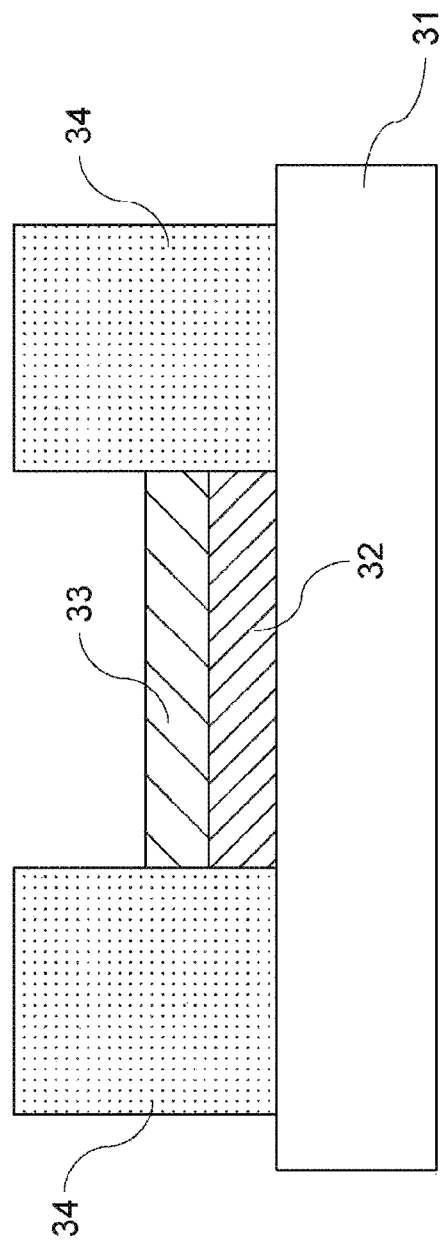
FIG. 17 is a cross-sectional view illustrating a stage of the method for producing the FET according to the seventh embodiment of the present invention at a point where a gate electrode is formed.

Subsequently, silicon oxide is formed as the first insulator 32 with a thickness of 20 nm, for example, on the surface of the p-type semiconductor substrate 31 by the thermal oxidation method or the CVD method. Subsequently, a P (phosphorus)-doped polysilicon layer is formed as the gate electrode 33 with a thickness of 20 nm, for example, on the first insulator 32 by the CVD method. Subsequently, the first insulator 32 and the gate electrode 33 are patterned by the photolithography method and the dry etching method using a photoresist as a mask, to form a layered structure of the first insulator 32 and the gate electrode 33 on the surface of the p-type semiconductor substrate 31 sandwiched by the second insulator 34. A cross-sectional view at this point is illustrated in FIG. 17. As described above, the reason for which the second insulator 34 is formed prior to the first insulator 32 is to prevent the first insulator 32 from being thermally oxidized and being thus changed in thickness at the same time when the second insulator 34 is formed by thermal oxidation.

Subsequently, a photoresist (not illustrated), in which a region in which the opening 35 is to be formed is open, is formed by the photolithography method. Subsequently, the photoresist is used as a mask, the gate electrode 33 and the first insulator 32 that are exposed are removed by the dry etching method, and the opening 35 is thus formed.

Figure 18:
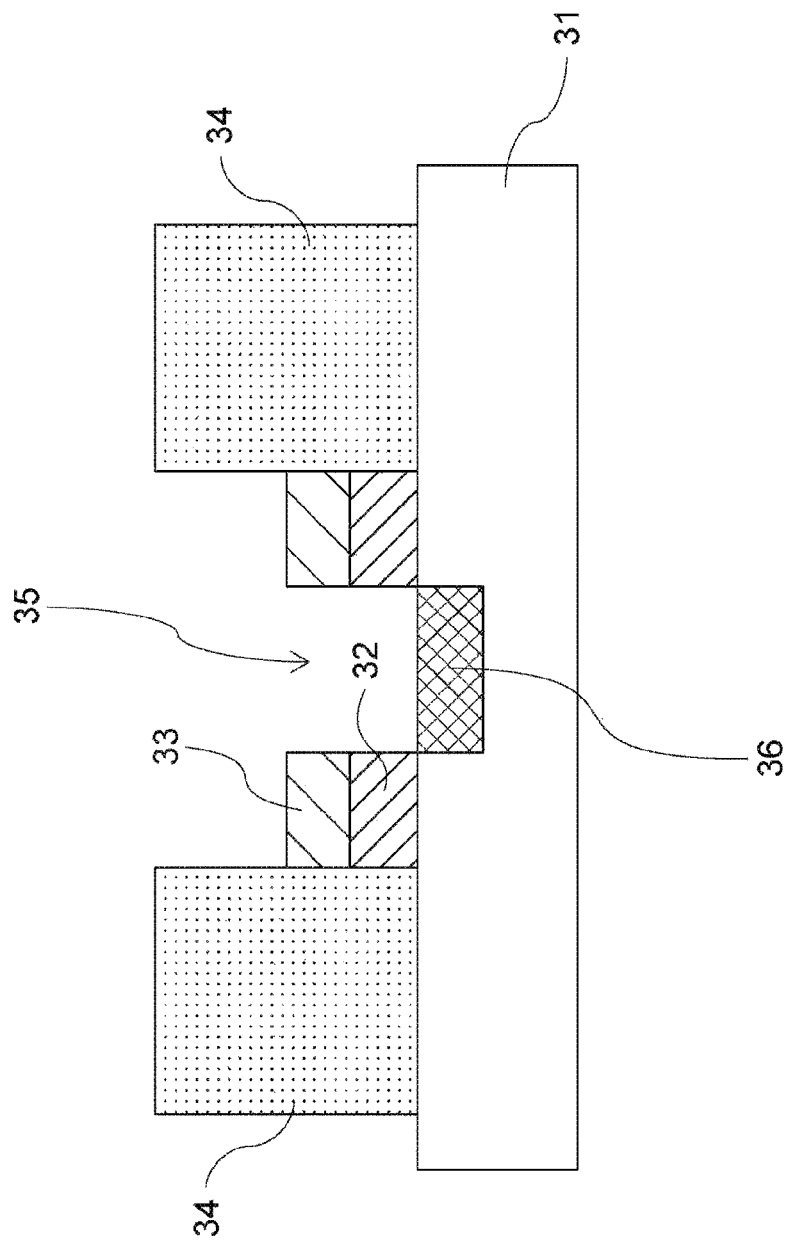
FIG. 18 is a cross-sectional view illustrating a stage of the method for producing the FET according to the seventh embodiment of the present invention, at a point where an n+ impurity diffusion layer is formed.
Figure 19:
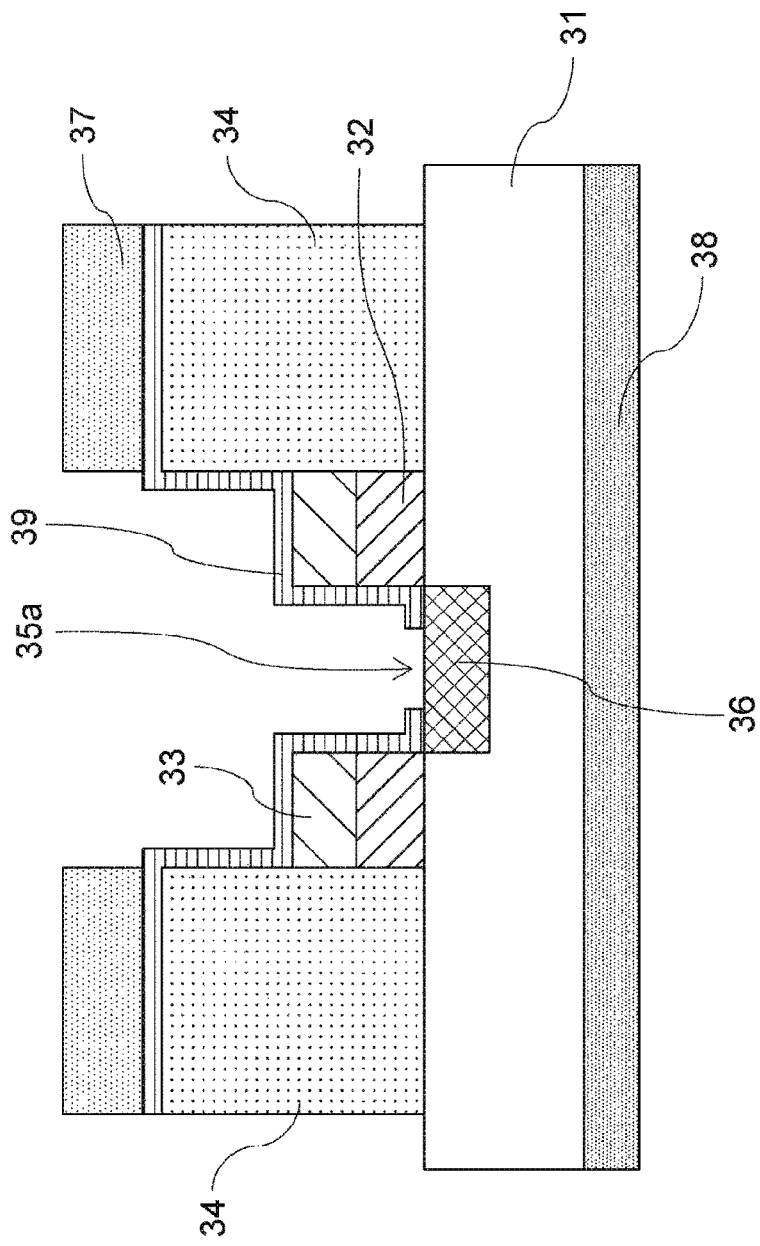
FIG. 19 is a cross-sectional view illustrating the structure of the FET according to the seventh embodiment of the present invention.

Subsequently, As (arsenic) ions are implanted into the p-type semiconductor substrate 31 in the opening 35 by the ion implantation method to form the n+ impurity diffusion layer 36, and the photoresist is then removed. A cross-sectional view at this point is illustrated in FIG. 18.

Subsequently, Al is formed with a thickness of 100 nm, for example, by the sputtering method, and the formed Al is processed into the shape of the drain electrode 37 by the photolithography method and the dry etching method. As illustrated in FIGS. 14 and 15, the drain electrode 37 is formed on the second insulator 34. Subsequently, Al is formed with a thickness of 200 nm, for example, on the entire backside of the p-type semiconductor substrate 31 by the sputtering method. The FET 200 illustrated in FIG. 14 can thus be produced through the processes described above.

In the producing method described above, a process of forming an insulator on the surface of the gate electrode 33 may be added. In this case, for example, after the process of forming the opening 35 and the n+ impurity diffusion layer 36 illustrated in FIG. 18, silicon oxide is formed as a third insulator 39 with a thickness equal to or larger than 5 nm and equal to or smaller than 10 nm, for example, by the CVD method. Subsequently, part of the third insulator 39 on the p-type semiconductor substrate 31 may be removed by the photolithography method and the dry etching method to form the opening 35a. Subsequently, the drain electrode 37 is formed on the third insulator 39 in a manner similar to the above, and the FET 200 having the structure illustrated in FIG. 19 can thus be produced.

(Effects)

In the first embodiment, the channel length L is a sum of the thicknesses of the first insulator 2, the gate electrode 3, and the second insulator 4. In contrast, in the present embodiment, channel length L can be determined only by the thickness of the second insulator 34. Thus, the channel length L can be easily adjusted and the degree of freedom in design of FETs can be improved as compared with the first embodiment. In addition, in the first embodiment, a three-layer structure of the first insulator 2, the gate electrode 3, and the second insulator 4 needs to be processed to form the opening 5. In contrast, in the FET 200 of the present embodiment, only a two-layer structure of the first insulator 32 and the gate electrode 33 needs to be processed to form the opening 35. Thus, the accuracy of processing the opening 35 can be improved as compared with the opening 5 in the first embodiment.

In addition, in the present embodiment, the third insulator 39 is formed on the surface of the gate electrode 33, which can prevent electrons from being trapped on the gate electrode 33 while electrons travel through the vacuum space in the opening 35 from the n+ impurity diffusion layer 36 toward the drain electrode 37. Consequently, a high-performance vacuum channel FET capable of increasing the source-drain current $I_{DS}$ can be achieved.

Eighth Embodiment

A vacuum channel field effect transistor circuit 300 (hereinafter referred to as an FET circuit 300) of an eighth embodiment is a complementary FET circuit constituted by lateral channel FETs having a fin structure.

Figure 20:
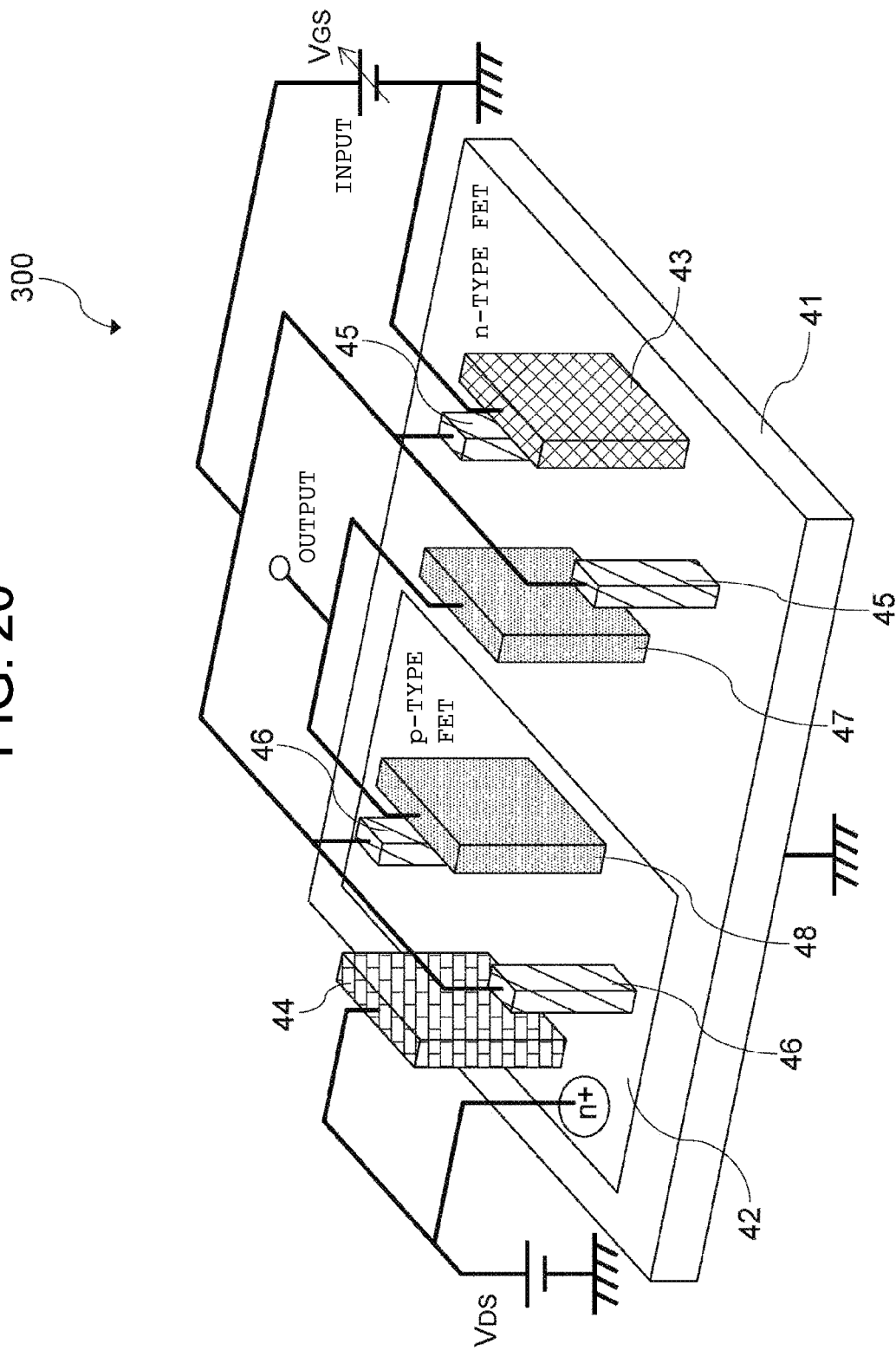
FIG. 20 is a perspective view illustrating a structure of an FET circuit according to an eighth embodiment of the present invention.

While the structures of vertical vacuum channel FETs in which charge carriers travel in the vertical direction (perpendicular direction) with respect to the surface of the semiconductor substrate have been described in the first to seventh embodiments described above, a structure of a lateral vacuum channel FET in which charge carriers travel in the lateral direction (parallel direction) with respect to the surface of the semiconductor substrate may be used. As illustrated in FIG. 20, the FET circuit 300 of the eighth embodiment includes an n-type FET and a p-type FET each having a lateral vacuum channel on a p-type semiconductor substrate 41. The n-type FET includes a gate electrode 45, a source electrode 43, and a drain electrode 47 on the p-type semiconductor substrate 41, and the p-type FET includes a gate electrode 46, a source electrode 44, and a drain electrode 48 on an n-well 42.

The gate electrode 45, the source electrode 43, and the drain electrode 47 of the n-type FET of the FET circuit 300 each have a fin shape extending in a direction perpendicular to the surface of the p-type semiconductor substrate 41. The fin shapes of the gate electrode 45, the source electrode 43, and the drain electrode 47 may be formed using part of the p-type semiconductor substrate 41, for example. The source electrode 43 and the drain electrode 47 face each other with a vacuum therebetween, and the distance between the source electrode 43 and the drain electrode 47 is equal to or larger than 40 nm and equal to or smaller than 60 nm, for example. The space between the source electrode 43 and the drain electrode 47 constitutes the vacuum channel space of the n-type FET. The gate electrode 45 is formed to face both sides of the vacuum channel space of the n-type FET and with predetermined distances from the source electrode 43 and the drain electrode 47.

In a case where the fin shape of the source electrode 43 of the n-type FET of the FET circuit 300 is formed using part of the p-type semiconductor substrate 41, it is preferable that the source electrode 43 be doped with an n-type impurity to form an n+ impurity diffusion layer, and that metal such as Al be formed on the surfaces of the gate electrode 45 and the drain electrode 47 as necessary.

The gate electrode 46, the source electrode 44, and the drain electrode 48 of the p-type FET of the FET circuit 300 each have a fin shape extending in a direction perpendicular to the surface of the p-type semiconductor substrate 41, in a manner similar to the n-type FET. The fin shapes may be formed using part of the p-type semiconductor substrate 41, for example. The source electrode 44 and the drain electrode 48 face each other with a vacuum therebetween, and the distance between the source electrode 44 and the drain electrode 48 is equal to or larger than 40 nm and equal to or smaller than 60 nm, for example. The space between the source electrode 44 and the drain electrode 48 constitutes the vacuum channel space of the p-type FET. The gate electrode 46 is formed to face both sides of the vacuum channel space of the p-type FET and with predetermined distances from the source electrode 44 and the drain electrode 48.

In a case where the fin shape of the source electrode 44 of the p-type FET of the FET circuit 300 is formed using part of the p-type semiconductor substrate 41, it is preferable that the source electrode 44 be doped with a p-type impurity to form a p+ impurity diffusion layer, and that metal such as Al be formed on the surfaces of the gate electrode 46 and the drain electrode 48 as necessary.

While it is described above that the gate electrode 45 faces both sides of the vacuum channel space of the n-type FET and that the gate electrode 46 faces both sides of the vacuum channel space of the p-type FET, the gate electrode 45 and the gate electrode 46 may be in the respective vacuum channel spaces. In this case, it is preferable to form insulators on the surfaces of the gate electrode 45 and the gate electrode 46 to prevent charge carriers from being attracted by the gate electrode 45 and the gate electrode 46, for example.

(Operation Principle)

Next, the operation of the n-type FET of the FET circuit 300 will be explained. In the n-type FET of the FET circuit 300, the vacuum space between the source electrode 43 and the drain electrode 47 constitutes the vacuum channel space as described above. Electrons that are charge carriers are emitted from the source electrode 43 into the vacuum channel space, travel through the vacuum channel space in the lateral direction (parallel direction) with respect to the surface of the p-type semiconductor substrate 41, and reach the drain electrode 47. The emission of electrons into the vacuum channel space is caused by bringing the gate-source voltage $V_{GS}$ to a predetermined voltage, and the traveling after the emission is caused by bringing the source-drain voltage $V_{DS}$ to a predetermined voltage. For turning the n-type FET of the FET circuit 300 ON, 0 V, for example, may be applied to the source electrode 43, +2 V, for example, may be applied to the drain electrode 47, and +1 V, for example, may be applied to the gate electrode 45.

The operation of the p-type FET of the FET circuit 300 will be explained. In the p-type FET, holes that are charge carriers are emitted from the source electrode 44 into the vacuum channel space, travel through the vacuum channel space in the lateral direction (parallel direction) with respect to the surface of the p-type semiconductor substrate 41, and reach the drain electrode 48. The emission of holes into the vacuum channel space is caused by bringing $V_{GS}$ to a predetermined voltage in a manner similar to the n-type FET of the FET 300, and the traveling after the emission is caused by bringing $V_{DS}$ to a predetermined voltage. For turning the p-type FET of the FET circuit 300 ON, +2 V, for example, may be applied to the source electrode 44, 0 V, for example, may be applied to the drain electrode 48, and +1 V, for example, may be applied to the gate electrode 46.

A case where the FET circuit 300 is a complementary inverter circuit will be described as an example of the complementary FET circuit constituted by lateral channel FETs. As illustrated in FIG. 20, in the FET circuit 300, the gate electrode 45 of the n-type FET and the gate electrode 46 of the p-type FET are connected with each other. In addition, the drain electrode 47 of the n-type FET and the drain electrode 48 of the p-type FET are connected with each other. The gate electrode 45 of the n-type FET and the gate electrode 46 of the p-type FET are connected with a voltage source that supplies an input voltage to the complementary inverter circuit. An output voltage from the complementary inverter circuit is output to the outside through the drain electrode 47 of the n-type FET and the drain electrode 48 of the p-type FET. A voltage source capable of supplying a GND voltage is connected with the source electrode 43 of the n-type FET, and a voltage source capable of supplying a positive voltage is connected with the source electrode 44 and the n-well 42 of the p-type FET.

For operation of the complementary inverter circuit, a GND voltage of 0 V, for example, is applied to the source electrode 43 of the n-type FET, and a positive voltage of +1 V, for example, is applied to the source electrode 44 and the n-well 42 of the p-type FET. Furthermore, a GND voltage, for example, is applied to the p-type semiconductor substrate 41. When a positive voltage of +1 V or a GND voltage of 0 V, for example, is applied, as an input signal input to the complementary inverter circuit, to the gate electrode 45 of the n-type FET and the gate electrode 46 of the p-type FET in this state, an output voltage, which is an output signal from the complementary inverter circuit, is output to the outside from the drain electrode 47 of the n-type FET and the drain electrode 48 of the p-type FET.

The example illustrated in FIG. 20 is an example in the case where the FET circuit 300 is a complementary inverter circuit, and various modifications can be made within the scope of the present invention. The connection diagram in FIG. 20 can be modified as necessary, and each of the voltages may be changed to a voltage supplied from another voltage source, and via another wiring and another circuit. In addition, the FET circuit 300 may be modified to another complementary FET circuit, such as a differential amplifier circuit, an SRAM circuit, or the like including a plurality of n-type FETs and p-type FETs. In addition, the input signal is not limited to the positive voltage of +2 V or 0 V, and a negative voltage may be applied instead of 0 V so as to increase the efficiency of emission of holes from the source electrode 44 of the p-type FET, for example.

(Effects)

In the lateral vacuum channel FET of the present embodiment, the areas of the source electrode and the drain electrode can be increased as compared with a vertical vacuum channel FET, and the source-drain current $I_{DS}$ can thus be increased. In addition, the source electrode and the drain electrode need not be insulated by insulators, and the size and the position of the gate electrode can also be easily adjusted, which increases the degree of freedom of design of FETs. Thus, a semiconductor device including a high-performance complementary vacuum channel FET can be achieved.

While the examples in which a silicon substrate is used as the semiconductor substrate have been described above in the first to eighth embodiments, other semiconductor substrates such as GaAs, GaN, or the like are also applicable.

What is claimed is:

1. A vacuum channel field effect transistor comprising:
   a semiconductor substrate;
   a first insulator on the semiconductor substrate;
   a gate electrode on the first insulator;
   a second insulator on the gate electrode;
   a drain electrode on the second insulator; and
   an n-type impurity diffusion layer formed in a part of a surface of p-type semiconductor or a p-type impurity diffusion layer formed in a part of a surface of a n-type semiconductor in the semiconductor substrate, a surface of the n-type impurity diffusion layer or the p-type impurity diffusion layer being in contact with a contact point between a bottom of a side face of the first insulator and a surface of the semiconductor substrate and being capable of emitting charge carriers when a predetermined voltage is applied, wherein
   application of predetermined voltages to the semiconductor substrate, the n-type impurity diffusion layer or the p-type impurity diffusion layer, the gate electrode, and the drain electrode causes charge carriers in an inversion layer of the semiconductor substrate in contact with the first insulator to flow into the n-type impurity diffusion layer or the p-type impurity diffusion layer and to travel through a vacuum or air faced by a first side wall including the side face of the first insulator, a side face of the gate electrode, a side face of the second insulator, and a side face of the drain electrode to the drain electrode.

2. The vacuum channel field effect transistor according to claim 1, comprising the type impurity diffusion layer, and wherein the charge carriers are electrons.

3. The vacuum channel field effect transistor according to claim 2, wherein application of a predetermined negative voltage or a GND voltage to the semiconductor substrate and the n-type impurity diffusion layer and predetermined positive voltages to the gate electrode and the drain electrode causes the electrons in the n-type impurity diffusion layer to travel through the vacuum or air faced by the first side wall to the drain electrode.

4. The vacuum channel field effect transistor according to claim 1, comprising the p-type impurity diffusion layer, and wherein the charge carriers are holes.

5. The vacuum channel field effect transistor according to claim 4, wherein application of a predetermined positive voltage or a GND voltage to the semiconductor substrate and the p-type impurity diffusion layer and predetermined negative voltages to the gate electrode and the drain electrode causes the holes in the p-type impurity diffusion layer to travel through the vacuum or air faced by the first side wall to the drain electrode.

6. The vacuum channel field effect transistor according to claim 1, wherein the charge carriers include charge carriers in an inversion layer formed in a surface of the semiconductor substrate in contact with the first insulator, and the inversion layer is connected with the n-type impurity diffusion layer or the p-type impurity diffusion layer.

7. The vacuum channel field effect transistor according to claim 1, including at least two first side walls.

8. The vacuum channel field effect transistor according to claim 1, wherein at least the side face of the gate electrode included in the first side wall is covered with an insulator.

9. The vacuum channel field effect transistor according to claim 1, wherein the drain electrode extends to a side of the n-type impurity diffusion layer or the p-type impurity diffusion layer relative to the first side wall.

10. The vacuum channel field effect transistor according to claim 1, wherein the drain electrode covers an entire top of a space of the vacuum or air faced by the first side wall.

11. The vacuum channel field effect transistor according to claim 1, wherein the first insulator is thinner than the second insulator.

12. A vacuum channel field effect transistor comprising:
    a semiconductor substrate;
    a first insulator on the semiconductor substrate;
    a gate electrode on the first insulator;
    a second insulator on the gate electrode;
    a drain electrode on the second insulator; and
    an n-type impurity diffusion layer formed in a part of a surface of p-type semiconductor or a p-type impurity diffusion layer formed in a part of a surface of a n-type semiconductor in the semiconductor substrate, a surface of the n-type impurity diffusion layer or the p-type impurity diffusion layer being in contact with a contact point between a bottom of a side face of the first insulator and a surface of the semiconductor substrate and being capable of emitting charge carriers when a predetermined voltage is applied, wherein
    application of predetermined voltages to the semiconductor substrate, the n-type impurity diffusion layer or the p-type impurity diffusion layer, the gate electrode, and the drain electrode causes charge carriers in an inversion layer of the semiconductor substrate in contact with the first insulator to flow into the n-type impurity diffusion layer or the p-type impurity diffusion layer and to travel through a vacuum or air faced by a first side wall including the side face of the first insulator and a side face of the gate electrode to the drain electrode, wherein the second insulator is between the surface of the semiconductor substrate and a bottom face of the drain electrode and adjacent to a second side wall including a side face of the first insulator and a side face of the gate electrode not being in contact with the n-type impurity diffusion layer or the p-type impurity diffusion layer.

13. The vacuum channel field effect transistor according to claim 1, wherein the first insulator and the second insulator include silicon oxide or silicon nitride.

14. The vacuum channel field effect transistor according to claim 1, further comprising an insulator for shielding a space in a side face direction or a top face direction of the vacuum channel field effect transistor from external air.

15. A semiconductor device comprising:
a plurality of field effect transistors each including:
a semiconductor substrate;
a first insulator on the semiconductor substrate;
a gate electrode on the first insulator;
a second insulator on the gate electrode;
a drain electrode on the second insulator; and
an n-type impurity diffusion layer formed in a part of a surface of p-type semiconductor or a p-type impurity diffusion layer formed in a part of a surface of a n-type semiconductor in the semiconductor substrate, a surface of the n-type impurity diffusion layer or the p-type impurity diffusion layer being in contact with a contact point between a bottom of a side face of the first insulator and a surface of the semiconductor substrate and being capable of emitting charge carriers when a predetermined voltage is applied, wherein
application of predetermined voltages to the semiconductor substrate, the n-type impurity diffusion layer or the p-type impurity diffusion layer, the gate electrode, and the drain electrode causes charge carriers in an inversion layer of the semiconductor substrate in contact with the first insulator to flow into the n-type impurity diffusion layer or the p-type impurity diffusion layer and to travel through a vacuum or air faced by a first side wall including the side face of the first insulator, a side face of the gate electrode, a side face of the second insulator, and a side face of the drain electrode to the drain electrode, and
the field effect transistors include an n-type field effect transistor comprising the n-type impurity diffusion layer in which the charge carriers are electrons, and a p-type field effect transistor comprising the p-type impurity diffusion layer in which the charge carriers are holes.

16. The semiconductor device according to claim 15, wherein the semiconductor device is a complementary inverter circuit, the gate electrode of the n-type field effect transistor and the gate electrode of the p-type field effect transistor are connected with each other, the drain electrode of the n-type field effect transistor and the drain electrode of the p-type field effect transistor are connected with each other, the n-type impurity diffusion layer is a source electrode of the n-type field effect transistor, and the p-type impurity diffusion layer is a source electrode of the p-type field effect transistor.

17. The semiconductor device according to claim 15, wherein the semiconductor substrate is an SOI substrate.

18. A vacuum channel field effect transistor comprising:
a semiconductor substrate;
a source electrode formed in a rectangular shape on the semiconductor substrate in a direction perpendicular to a surface of the semiconductor substrate;
a drain electrode formed in a rectangular shape in a direction perpendicular to the surface of the semiconductor substrate, the drain electrode facing the source electrode with a vacuum or air therebetween; and
a gate electrode formed in a rectangular shape in a direction perpendicular to the surface of the semiconductor substrate, and facing the vacuum or air between the source electrode and the drain electrode, wherein
application of predetermined voltages to the source electrode, the gate electrode, and the drain electrode causes charge carriers in the source electrode to travel through the vacuum or air to the drain electrode.

19. The vacuum channel field effect transistor according to claim 18, comprising an n-type impurity diffusion layer in a surface of the source electrode, wherein application of a predetermined negative voltage or a GND voltage to the n-type impurity diffusion layer and predetermined positive voltages to the gate electrode and the drain electrode causes electrons in the n-type impurity diffusion layer to travel through the vacuum or air to the drain electrode.

20. The vacuum channel field effect transistor according to claim 18, comprising a p-type impurity diffusion layer in a surface of the source electrode, wherein application of a predetermined positive voltage or a GND voltage to the p-type impurity diffusion layer and predetermined negative voltages to the gate electrode and the drain electrode causes holes in the p-type impurity diffusion layer to travel through the vacuum or air to the drain electrode.

* * * * *